(12) United States Patent
John et al.

(10) Patent No.: US 8,354,990 B2
(45) Date of Patent: Jan. 15, 2013

(54) DRIVE CIRCUIT, A DISPLAY DEVICE PROVIDED WITH THE SAME

(75) Inventors: Gareth John, Berkshire (GB); Patrick Zebedee, Oxfordshire (GB); Michael James Brownlow, Oxfordshire (GB); Tim Gasser, Warks (GB); Jeremy Lock, Oxfordshire (GB); Graham Andrew Cairns, Oxfordshire (GB); Jaganath Rajendra, Oxord (GB); Harry Garth Walton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 1217 days.

(21) Appl. No.: 12/087,870

(22) PCT Filed: Jan. 29, 2007

(86) PCT No.: PCT/JP2007/051836
§ 371 (c)(1),
(2), (4) Date: Jul. 16, 2008

(87) PCT Pub. No.: WO2007/088986
PCT Pub. Date: Aug. 9, 2007

(65) Prior Publication Data
US 2009/0002357 A1 Jan. 1, 2009

(30) Foreign Application Priority Data
Jan. 31, 2006 (GB) .................................. 0601894.9

(51) Int. Cl.
*G09G 3/36* (2006.01)
(52) U.S. Cl. ............. 345/100; 345/87; 345/98; 345/204
(58) Field of Classification Search .................... 345/87, 345/89, 98–100
See application file for complete search history.

(56) References Cited

U.S. PATENT DOCUMENTS

| | | | |
|---|---|---|---|
| 5,061,920 A | 10/1991 | Nelson | |
| 5,105,187 A | 4/1992 | Plus et al. | |
| 5,414,443 A * | 5/1995 | Kanatani et al. | 345/95 |
| 5,578,957 A * | 11/1996 | Erhart et al. | 327/333 |
| 6,330,196 B1 | 12/2001 | Protzman | |
| 6,483,889 B2 | 11/2002 | Kim et al. | |
| 6,724,239 B2 | 4/2004 | Price et al. | |
| 6,750,840 B2 * | 6/2004 | Morita | 345/100 |
| 6,765,552 B2 | 7/2004 | Yamazaki et al. | |
| 7,564,441 B2 * | 7/2009 | Nakajima et al. | 345/100 |
| 7,646,371 B2 * | 1/2010 | Maki | 345/98 |
| 2003/0174118 A1 | 9/2003 | Sato et al. | |
| 2004/0109526 A1 | 6/2004 | Park et al. | |
| 2005/0012887 A1 | 1/2005 | Koyama et al. | |
| 2005/0030276 A1 | 2/2005 | Murakami et al. | |

FOREIGN PATENT DOCUMENTS

| | | |
|---|---|---|
| JP | 7-104661 | 11/1995 |
| JP | 2003-202840 | 7/2003 |

* cited by examiner

*Primary Examiner* — Duc Dinh
(74) *Attorney, Agent, or Firm* — Harness, Dickey & Pierce

(57) ABSTRACT

In one embodiment of the present invention, a drive circuit includes: a logic block connected between a source of a first voltage and a source of a second voltage, and a sampler including a plurality of sampling circuits. Each sampling circuit is for sampling, in use, an input data signal and outputting a voltage to a respective output. The drive circuit further includes a voltage booster having plurality of voltage boost circuits, each voltage boost circuit being associated with a respective one of the sampling circuits and, in use, generating a boosted voltage signal and providing the boosted voltage signal to the respective sampling circuit. Each voltage boost circuit is connected between the source of the first voltage and the source of the second voltage. The logic block may be, but is not limited to, a shift register.

29 Claims, 24 Drawing Sheets

SR0
$V_{SHIFT0n}$
$V_{SHIFT0p}$

SR1
$V_{SHIFT1n}$
$V_{SHIFT1p}$

SR(m-2)
$V_{SHIFT(m-2)n}$
$V_{SHIFT(m-2)p}$

SR(m-1)
$V_{SHIFT(m-1)n}$
$V_{SHIFT(m-1)p}$

Col0$_{RGB}$

Col1$_{RGB}$

Col(m-2)$_{RGB}$

Col(m-1)$_{RGB}$

FIG. 4
PRIOR ART
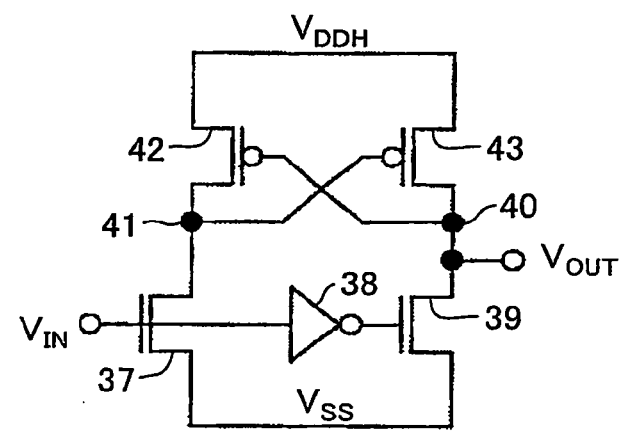
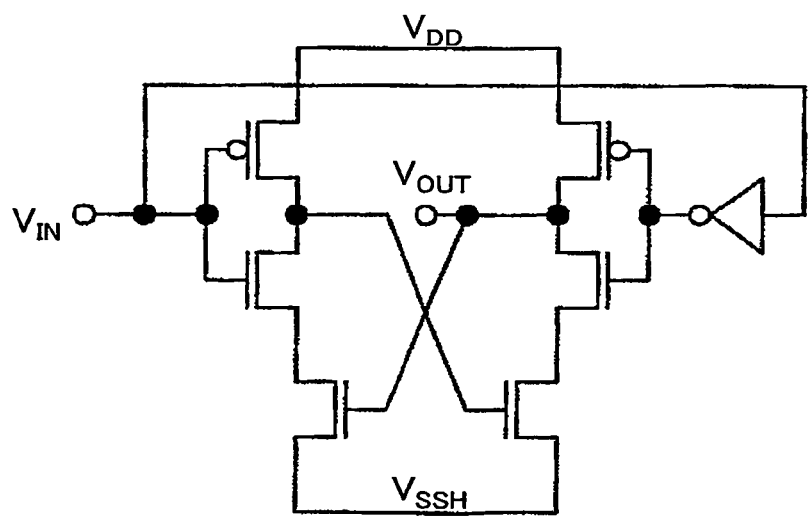

SR0 ─────
$V_{SHIFT0n}$ ───
$V_{SHIFT0p}$ ─── ───

SR1 ─────
$V_{SHIFT1n}$ ───
$V_{SHIFT1p}$ ─── ───

SR(m-2) ─────
$V_{SHIFT(m-2)n}$ ───
$V_{SHIFT(m-2)p}$ ─── ───

SR(m-1) ─────
$V_{SHIFT(m-1)n}$ ───
$V_{SHIFT(m-1)p}$ ─── ───

Col0$_{RGB}$

Col1$_{RGB}$

Col(m-2)$_{RGB}$

Col(m-1)$_{RGB}$

FIG. 9 (a)   PRIOR ART
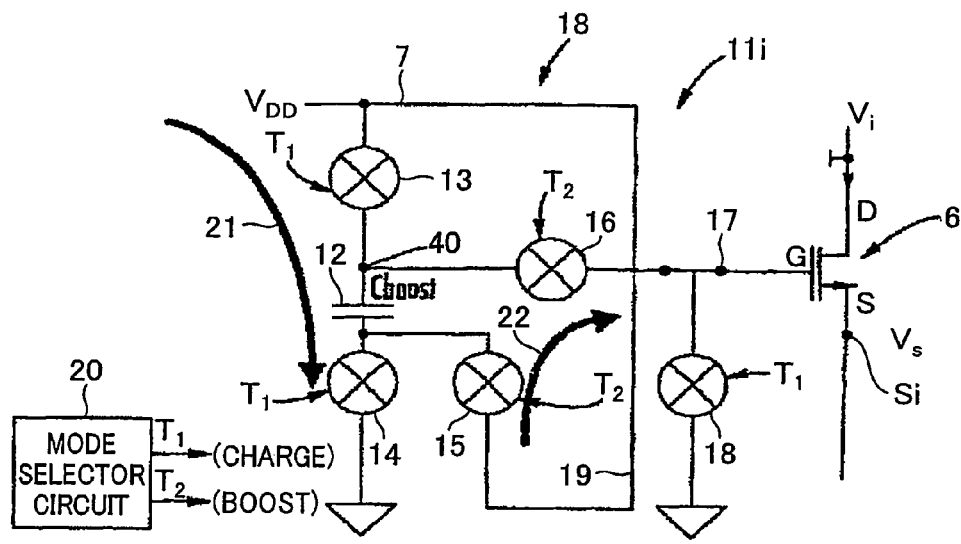
FIG. 9 (b)   PRIOR ART
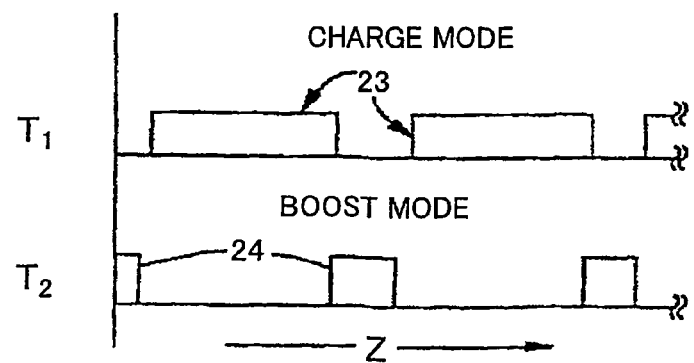

SR0 ———
$V_{SHIFT0n}$ ··········
$V_{SHIFT0p}$ -----

SR1 ———
$V_{SHIFT1n}$ ··········
$V_{SHIFT1p}$ -----

SR(m-2) ———
$V_{SHIFT(m-2)n}$ ··········
$V_{SHIFT(m-2)p}$ -----

SR(m-1) ———
$V_{SHIFT(m-1)n}$ ··········
$V_{SHIFT(m-1)p}$ -----

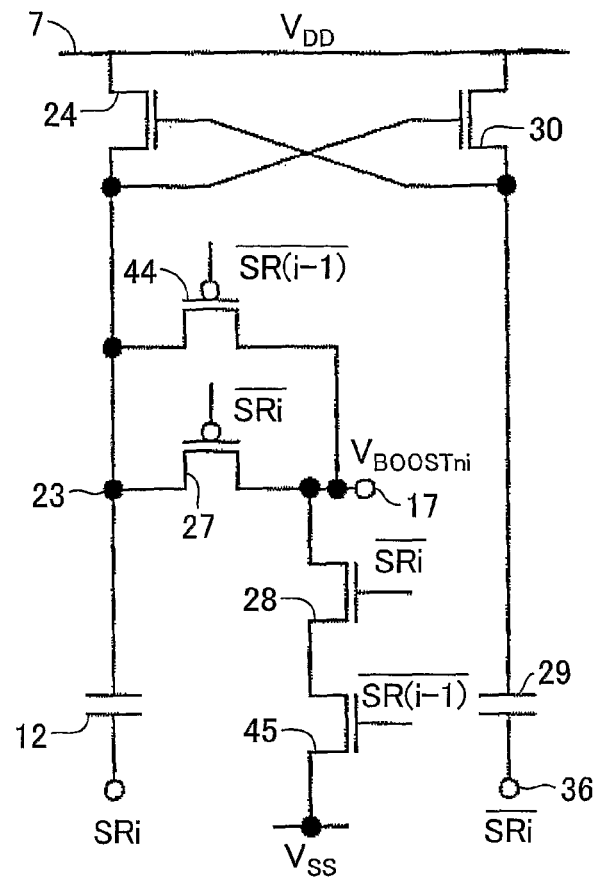
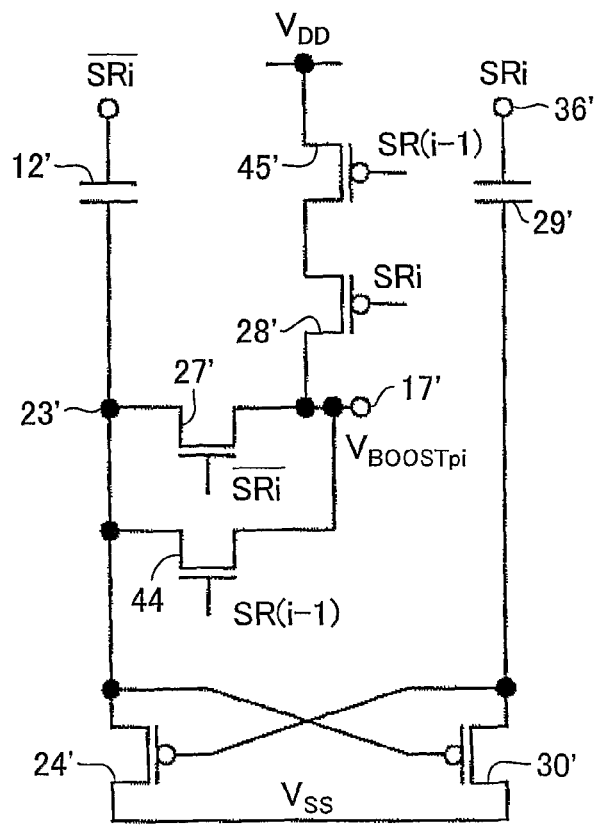
FIG. 17

FIG. 18
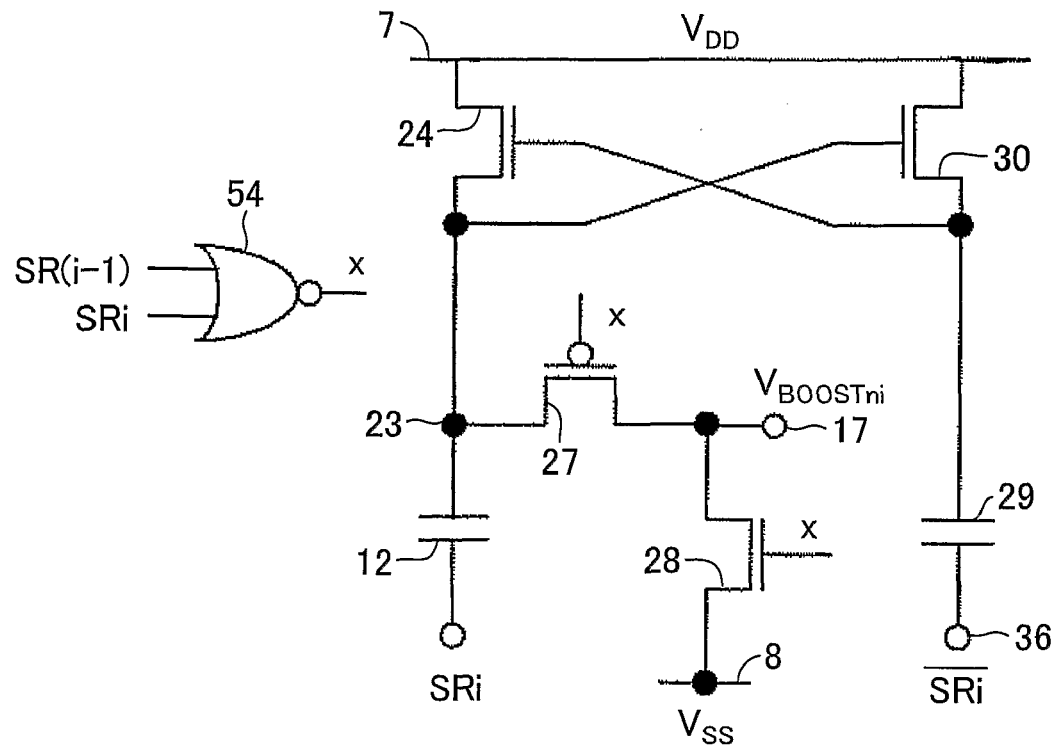
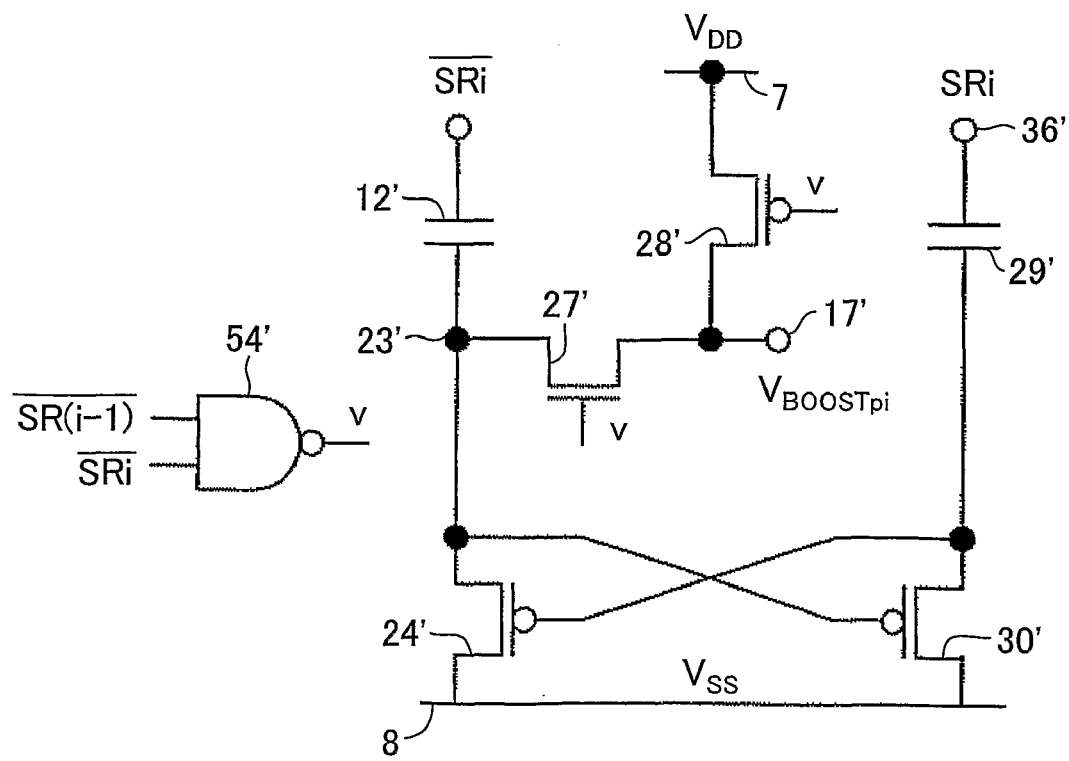

FIG. 21
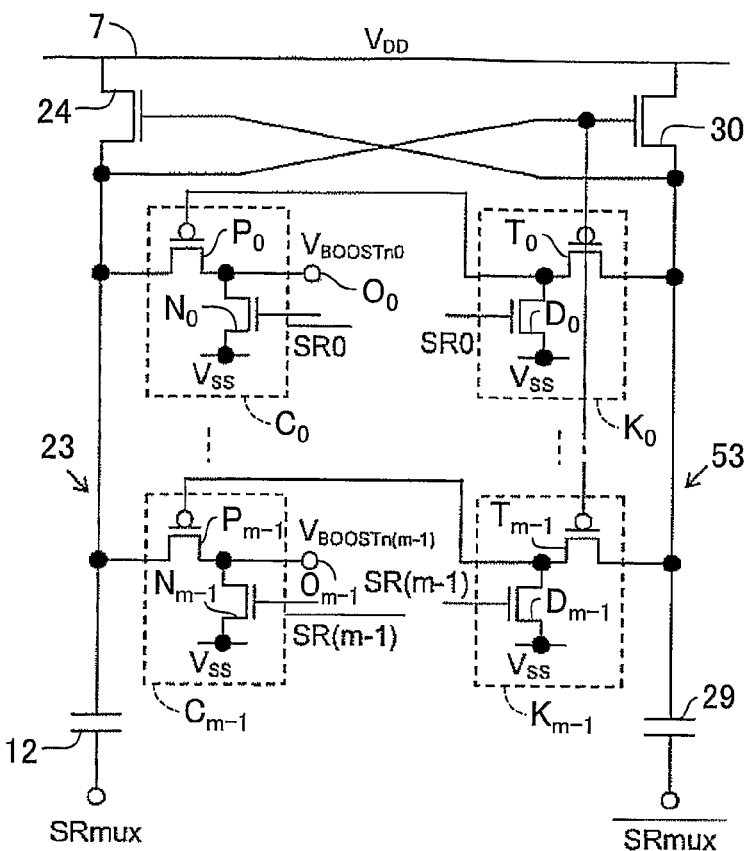
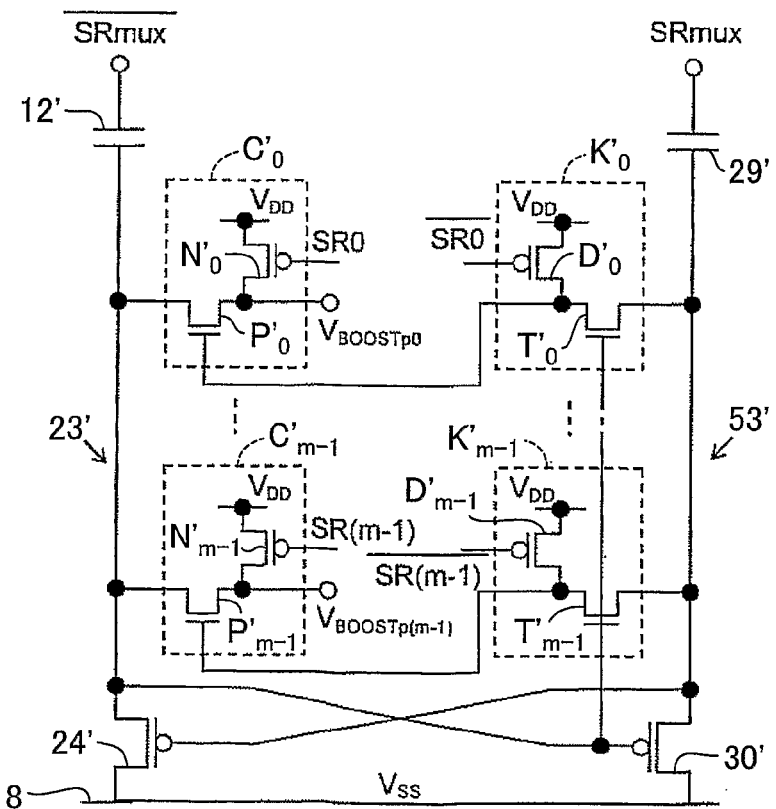

DRIVE CIRCUIT, A DISPLAY DEVICE PROVIDED WITH THE SAME

TECHNICAL FIELD

The present invention relates to a drive circuit, in particular to a drive circuit suitable for use in a source driver circuit in an active matrix liquid crystal display (AMLCD).

BACKGROUND ART

FIG. 1 is a schematic view of an active matrix liquid crystal display. As is well-know, an AMLCD comprises a liquid crystal layer in which a plurality of independently addressable pixels $P_{ij}$ are defined, for example by a patterned electrode. The pixels $P_{ij}$ are generally arranged in a matrix of rows and columns, as shown in FIG. 1. The pixel matrix in FIG. 1 has m pixel columns and n pixel rows. Each pixel contains a portion $D_{ij}$ of the liquid crystal layer of the AMLCD, connected to a switching element $T_{ij}$ which may be, for example, a thin film transistor. The gates of all TFTs within a row j of pixels are connected to a gate line $G_j$, and each gate line is connected to a gate driver 1. The sources of all TFTs within a column i of pixels are connected to a source line $S_i$, and each source line is connected to a source driver 2. Image data for display is input to the source driver 2, for example over video lines.

In a typical display-driving scheme, the gate driver 1 selects a row of pixels by driving one gate line $G_j$ to be "high" thereby to turn on all the TFTs whose gates are connected to that gate line, and keeping all other gate lines "low". The source driver 2 samples input image data, and outputs corresponding voltages to each of the source lines. The voltage output on a particular source line is coupled to the pixel that is in the column of pixels connected to that source line and that is connected to the gate line $G_j$ which is being driven "high" by the gate driver.

Once the image data for a row of pixels has been sampled by the source driver and the source driver has output corresponding voltages to each source line, the gate driver selects the next row of pixels by driving another gate line, usually the next gate line $G_{j+1}$, "high" and keeping all other gate lines "low", and the above process is repeated. Usually, an image is displayed by selecting pixels from left to right and from top to bottom.

Each pixel $P_{ij}$ may comprise a capacitor $C_{ij}$ connected in parallel with the liquid crystal element $D_{ij}$, for stabilising the voltage maintained across the liquid crystal element $D_{ij}$ while the TFT $T_{ij}$ is off between two successive operations of addressing that pixel.

In a full colour AMLCD, each pixel within the pixel matrix may typically consist of a red segment, a green segment and a blue segment. Each segment corresponds generally to the pixel $P_{ij}$ shown in FIG. 1, and each segment contains a TFT to control the voltage applied across the part of the liquid crystal layer in that segment. Thus, in a full-colour AMLCD there are three source lines for each one column of pixels.

A typical source driver is shown in FIG. 2. The source driver 2 contains a shift register 3, a level shifter 4 comprising a plurality of level shifter circuits $4_i$ (where i=0, 1, 2 . . . (m−1)), and a sampler 5 comprising a plurality of sampling circuits $5_i$ (where i=0, 1, 2 . . . (m−1)). The shift register 3 is connected to first and second voltage supply lines 7, 8 which provide first and second supply voltages $V_{DD}$, $V_{SS}$ respectively. The sampler 5 has input data lines 9 for receiving an input data signal that defines a image to be displayed on the AMLCD; the input data lines 9 may be video lines and the input data signal may be a video signal. Each sampling circuit $5_i$ provides, in dependence on the input data signal, an output signal that is fed to the source line $S_i$ connected to the transistors $T_{ij}$ of the $i^{th}$ column of pixels. (FIG. 2 shows a source driver for a full-colour display, so that each sampling circuit $5_i$ in fact provides three output signals for a column of pixels, one for the red segment of the pixel being addressed, one for the green segment of the pixel, and one for the blue segment of the pixel; a source driver for a mono-chromatic display would provide only a single output signal for a column of pixels.)

FIG. 2 illustrates a single phase source driver, which provides an output signal to only one column of pixels at a time. In a first time period, the first output SR0 of the shift register is high and all other outputs SR1 . . . SR(m−1) are low, so that only the sampling switches 6 in the first sampling circuit $5_0$ are actuated (i.e., closed) to provide an output signal from the sampling circuit $5_0$. In the next time period the second output SR1 of the shift register is high and all other outputs SR0 and SR2 . . . SR(m−1) are low, so that only the second sampling circuit $5_1$ is actuated to provide an output signal, and so on. This is shown in FIGS. 3(a)-3(h), which illustrate the operation of a single phase source driver. FIG. 3(a) illustrates the first time period in which SR0 is high and all other outputs of the shift register 3 are low, FIG. 3(b) illustrates the second time period in which SR1 is high and all other outputs of the shift register 3 are low, FIG. 3(c) illustrates the penultimate time period in which the penultimate output SR(m−2) is high and all other outputs of the shift register 3 are low, and FIG. 3(d) illustrates the final time period in which the last output SR(m−1) is high and all other outputs of the shift register 3 are low. The full line in FIGS. 3(a) to 3(d) represents the $i^{th}$ output SRi from the shift register, the dotted line labelled $V_{SHIFTin}$ represents suitable input voltages to the $i^{th}$ sampling circuit of the sampler 5 for driving the gate of an n-type TFT, and the broken line labelled $V_{SHIFTip}$ represents suitable input voltages to the $i^{th}$ sampling circuit of the sampler 5 for driving the gate of a p-type TFT. The bounds of the signals SRi are the voltages $V_{SS}$ and $V_{DD}$ shown in FIG. 2. The bounds of the $V_{SHIFT}$ signals are the voltages $V_{SSH}$ and $V_{DDH}$ shown in FIG. 2. FIGS. 3(e) to 3(h) each represent the source lines of a column of pixels, and show the data transitions on the source lines as a row of image data is sampled. The transitions in FIG. 3(e) are triggered by the first output SR0 of the shift register shown in FIG. 3(a), the transitions in FIG. 3(f) are triggered by the output SR1 of the shift register shown in FIG. 3(b), the transitions in FIG. 3(g) are triggered by the output SR(m−2) of the shift register shown in FIG. 3(a), and the transitions in FIG. 3(h) are triggered by the output SR(m−1) of the shift register shown in FIG. 3(d).

In addition to single phase source drivers, multi-phase source drivers are also known. In a multi-phase source driver the image data are sampled N columns at a time, where N (an integer) is the phase of the system.

The sampling switches 6 in the sampling circuits $5_i$ are typically TFT analogue switches. In principle, the gates of the sampling switches 6 could be driven directly by the output signals SRi from the shift register 3. However, it is often desirable to drive the gates of the sampling switches at a voltage that is higher than the upper voltage level output by the shift register (in the case of an n-type TFT as a sampling switch), or at a voltage that is lower than the lower voltage level output by the shift register (in the case of a p-type TFT as a sampling switch). An increase in the gate-source voltage applied across an n-type TFT sampling switch 6, or a decrease in the gate-source voltage applied across a p-type TFT sampling switch 6, allows the area of the TFT to be reduced accordingly, so reducing the physical size of the source driver. Moreover, smaller sampling switches reduce the capacitive loading of the video lines 9, thereby reducing the dynamic power consumed by the source driver.

It is therefore known to provide the level shifter 4 between the shift register 3 and the sampler 5, to increase the "swing" of the output of the shift register (i.e., to increase the difference between the upper and lower limits of the shift register output). FIG. 2 shows a typical prior art source driver, in which the level shifter operates from additional voltage power supply rails that provide voltages $V_{DDH}$, $V_{SSH}$, where $V_{DDH} > V_{DD}$ and $V_{SSH} < V_{SS}$ (it is assumed that $V_{DD} > V_{SS}$), and increase the swing of the shift register signals to these levels. That is, the level shifter 4 can output a voltage as great as $V_{DDH}$ or as low as $V_{SSH}$, whereas the shift register can output a voltage only as great as $V_{DD}$ or only as low as $V_{SS}$. However, the need to provide the additional voltages sources $V_{DDH}$, $V_{SSH}$ complicates the source driver. Moreover, the saving in power consumption arising from a reduction in the size of the TFT switches 6 may be offset by the increased power consumption of the level shifters and any associated buffer circuits.

Typical level shifter circuits are shown in FIG. 4. When the input voltage to the upper half of the circuit is "low" the transistor 37 is off, but the transistor 39 is on since the output of the inverter 38 is "high" so that the output 40 of the upper half of the circuit is connected to the $V_{SS}$ supply line. When the input voltage to the upper half of the circuit goes "high" the transistor 37 switches on and connects node 41 to the $V_{SS}$ supply line and so applies a voltage $V_{SS}$ to the gate of the p-transistor 43. This turns the transistor 43 on, thereby connecting the output 40 of the upper half of the circuit to the $V_{DDH}$ supply line. At the same time the p-transistor 42 is switched off so as to isolate the node 41 from the $V_{DDH}$ supply line. Thus, the upper part of the circuit of FIG. 4 can provide an output voltage greater than $V_{DD}$; the lower part of the circuit can similarly provide an output voltage lower than $V_{SS}$. These circuits may be cascaded to generate the waveforms shown in FIGS. 3(a) to 3(h), or may be used separately to generate the waveforms shown in FIGS. 5(a) to 5(h). The waveforms shown in FIGS. 5(a) to 5(h) correspond to the waveforms shown in FIGS. 3(a) to 3(h) respectively. The bounds of the $V_{SHIFTn}$ signals in FIGS. 5(a) to 5(d) are the voltages $V_{DDH}$ and $V_{SS}$ shown in FIG. 2, and the bounds of the $V_{SHIFTp}$ signals in FIGS. 5(a) to 5(d) are the voltages $V_{DD}$ and $V_{SSH}$ shown in FIG. 2.

There are a number of prior art documents which describe a source driver of the general type shown in FIG. 2 having a level shifter interposed between the shift register and the sampler. In general, these prior art source drivers suffer from the requirement to provide additional high voltage power supply rails and control lines for the level shifters. The high voltage rails in particular can significantly increase the power consumption of the level shifters and any buffering using these rails.

U.S. Pat. No. 6,765,552 describes a display device with a stage of level shifters 4 (denoted as "LS") between a shift register 3 and a sampling circuit 5, as shown in FIG. 6. However, the level shifters require a separate power supply voltage.

US patent application No. 2005/0012887 describes a display device with level shifters 4 operating from a separate power supply, as shown in FIG. 6. The device uses TFTs of a single type (either n-type or p-type).

US patent application No. 2004/0109526 describes a single-type shift register with built-in level shifters (denoted as "LS") operating from a separate power supply. The level shifters also require additional clocking signals.

U.S. Pat. No. 6,483,889 describes a shift register with level shifters operated from a separate power supply. This document provides the basis for the display device of US patent application No. 2005/0012887.

U.S. Pat. No. 5,105,187 describes a shift register with internal voltage boosting. The voltage boosting eliminates the need to provide additional voltage supply rails but requires additional boost control lines.

U.S. Pat. No. 5,061,920 describes a source driving scheme which uses level shifters to shift the logical level of the data to a switching level, implying the use of conventional level shifters.

US 2005/0030276 describes a shift register including control circuits corresponding to respective blocks. A level shifter of the next stage is controlled by one of the outputs of the shift register and one of the outputs of a series of flip-flop circuits. The level shifter operates only for the minimum period required to output the shifted output from the current block, thereby reducing the power consumption.

DISCLOSURE OF INVENTION

The present invention provides a drive circuit comprising: a logic block connected between a source of a first voltage and a source of a second voltage, the first voltage being greater than the second voltage; and at least one sampling circuit, the or each sampling circuit for sampling an analogue input and outputting a voltage to a respective output; wherein the logic block outputs, in use, a respective output signal for each sampling circuit; wherein the drive circuit further comprises at least one voltage boost circuit, the or each voltage boost circuit being associated with a respective one of the sampling circuits and, upon receiving the respective signal output from the logic block, generating a boosted voltage signal and providing the boosted voltage signal to the respective sampling circuit; and wherein each voltage boost circuit is connected between the source of the first voltage and the source of the second voltage.

The voltage boost circuits "boost" the input signals to the sampling circuits beyond the range defined between the first voltage supply and the second voltage supply, and can provide a voltage greater than the first supply voltage or can provide a voltage lower than the second supply voltage, but without requiring additional supply rails and control lines—in a drive circuit of the invention, the voltage boost circuits are operated by the same supply voltages used to operate the logic block. The present invention thus allows small sampling switches to be used in the sampling circuits, since the input signals to the sampling circuits are boosted, but at the same time avoids the need to provide any additional high voltage power supply rails and control lines for the voltage boost circuits. As a result, the reduction in power consumption obtained by the use of small sampling switches is not offset by the presence of additional high voltage power supply rails, and a drive circuit of the invention has a low power consumption. A drive circuit of the invention is thus particularly suitable for use in a mobile device, where a low power consumption is highly desirable.

Each voltage boost circuit may comprise a boost capacitor having a first terminal connectable to the input to a respective sampling circuit; a charging circuit for charging, in a charging period, the boost capacitor to substantially one of the first and second voltages; and a boost circuit for, in a boosting period, connecting a second terminal of the boost capacitor to a boost bias voltage.

By charging the boost capacitor to the first voltage and then applying a boost bias voltage to the second terminal of the boost capacitor, it is possible to raise the potential of the first terminal of the boost capacitor well above the first voltage. Conversely, by charging the boost capacitor to the second voltage and then applying a boost bias voltage to the second terminal of the boost capacitor, it is possible to lower the potential of the first terminal of the boost capacitor well below the second voltage.

The boost bias voltage may be one of the first and second voltages.

The charging circuit may comprise a first switch connected between the source of the first voltage and the first terminal of the boost capacitor.

The boost circuit may comprise a second switch connected between the source of the first voltage and the second terminal of the boost capacitor.

The boost circuit may comprise a second switch having a first terminal connected to the source of the first or second voltage, the second switch being controlled by the potential at the first terminal of the boost capacitor; and the first switch may be controlled by the potential at the second terminal of the second switch.

The boost bias voltage may be a respective output signal from the logic block.

Each voltage boost circuit may comprise a pass switch for disconnecting the first terminal of the boost capacitor from an output of the voltage boost circuit during the charging period.

Each voltage boost circuit may further comprise a discharging switch for connecting the output of the voltage boost circuit to the other of the first and second voltages, the discharging switch being controlled to be open when the pass switch is closed.

The first switch may be a transistor. It may be a diode-connected transistor.

The first switch may be controlled by a respective output signal from the logic block. For example, the first switch may be capacitively coupled to a respective output signal from the logic block.

The logic block may be a shift register.

It should be noted that the term "shift register" can have two different meanings. A true "shift register" is a cascade of flip-flop circuits which can shift arbitrary data along its length. However, "walking one" types of logic block, which can only shift a single logic "one" along their length, are also commonly referred to as a "shift register". The term "shift register" as used herein is intended to cover both a "true shift register" (i.e., a logic block which can shift arbitrary data along its length), and a "walking one" logic block which can shift only a single logic "one" along its length.

Each voltage boost circuit may comprise a second pass switch for connecting the first terminal of the boost capacitor to the output of the voltage boost circuit during at least part of the charging period. This allows the output of the voltage boost circuit to be "pre-charged". Pre-charging of the output of the voltage boost circuit may also be provided by suitably controlling the first pass switch and the first discharging switch, and this enables pre-charging to be provided without the second pass switch.

The output of a voltage boost circuit is connectable to the output of a preceding voltage boost circuit. This allows charge to be shared between one voltage boost circuit and the next.

The drive circuit may further comprise a switch for connecting the first terminal of the boost capacitor to a storage capacitor during the boost phase. The storage capacitor can be used to maintain the potential of a voltage supply rail at the boosted voltage.

The voltage boost circuits may share a common boost capacitor. Use of a common boost capacitor reduces the number of capacitors required.

Each voltage boost circuit may generate a voltage signal having a voltage greater than the first voltage. Such a voltage is suitable for driving an n-type sampling switch. Alternatively, each voltage boost circuit may generate a voltage signal having a voltage lower than the second voltage. Such a voltage is suitable for driving a p-type sampling switch. Alternatively, each voltage boost circuit may generate, at a first output, a first voltage signal having a voltage greater than the first voltage and may generate, at a second output, a second voltage signal having a voltage lower than the second voltage. Such a voltage boost circuit can drive an n-type sampling switch and a p-type sampling switch.

A second invention provides a display device comprising a drive circuit of the first aspect.

The drive circuit may comprise a switch for connecting the first terminal of the boost capacitor to a storage capacitor during the boost phase.

The voltage boost circuits may share a common boost capacitor.

The voltage boost circuit may comprise a second switch having a first terminal connected to the source of the first or second voltage, the second switch being controlled by the potential at the first terminal of the boost capacitor; and the first switch may be controlled by the potential at the second terminal of the second switch.

Each voltage boost circuit may generate a boosted voltage signal having a voltage greater than the first voltage.

Each voltage boost circuit may generate a boosted voltage signal having a voltage lower than the second voltage.

Each voltage boost circuit may generate, at a first output, a first boosted voltage signal having a voltage greater than the first voltage and generates, at a second output, a second boosted voltage signal having a voltage lower than the second voltage.

The display device may comprise a plurality of source lines, and each source line may be connected to a respective output of the drive circuit. In this embodiment, the drive circuit of the invention acts as or is part of a source driver for the display device (the source driver may comprise other circuits in addition to a drive circuit of the invention).

The display device may comprise a liquid crystal display device, and it may comprise an active matrix liquid crystal display device.

BRIEF DESCRIPTION OF DRAWINGS

Preferred embodiments of the present invention will now be described with reference to the accompanying drawings, in which:

FIG. 4 shows a typical level shifter circuit;

FIG. 9(a) shows a voltage boost circuit suitable for use in a drive circuit of the present invention;

FIG. 9(b) shows timing signals for the circuit of FIG. 9(a);

FIG. 17 shows another voltage boost circuit suitable for use in a drive circuit of the present invention;

FIG. 18 shows another voltage boost circuit suitable for use in a drive circuit of the present invention;

FIG. 21 shows another voltage boost circuit suitable for use in a drive circuit of the present invention;

BEST MODE FOR CARRYING OUT INVENTION

The present invention will be described primarily with reference to its application as a source driver circuit. However, a drive circuit of the invention is not limited to use as a source driver circuit but has other possible applications.

Figure 8:
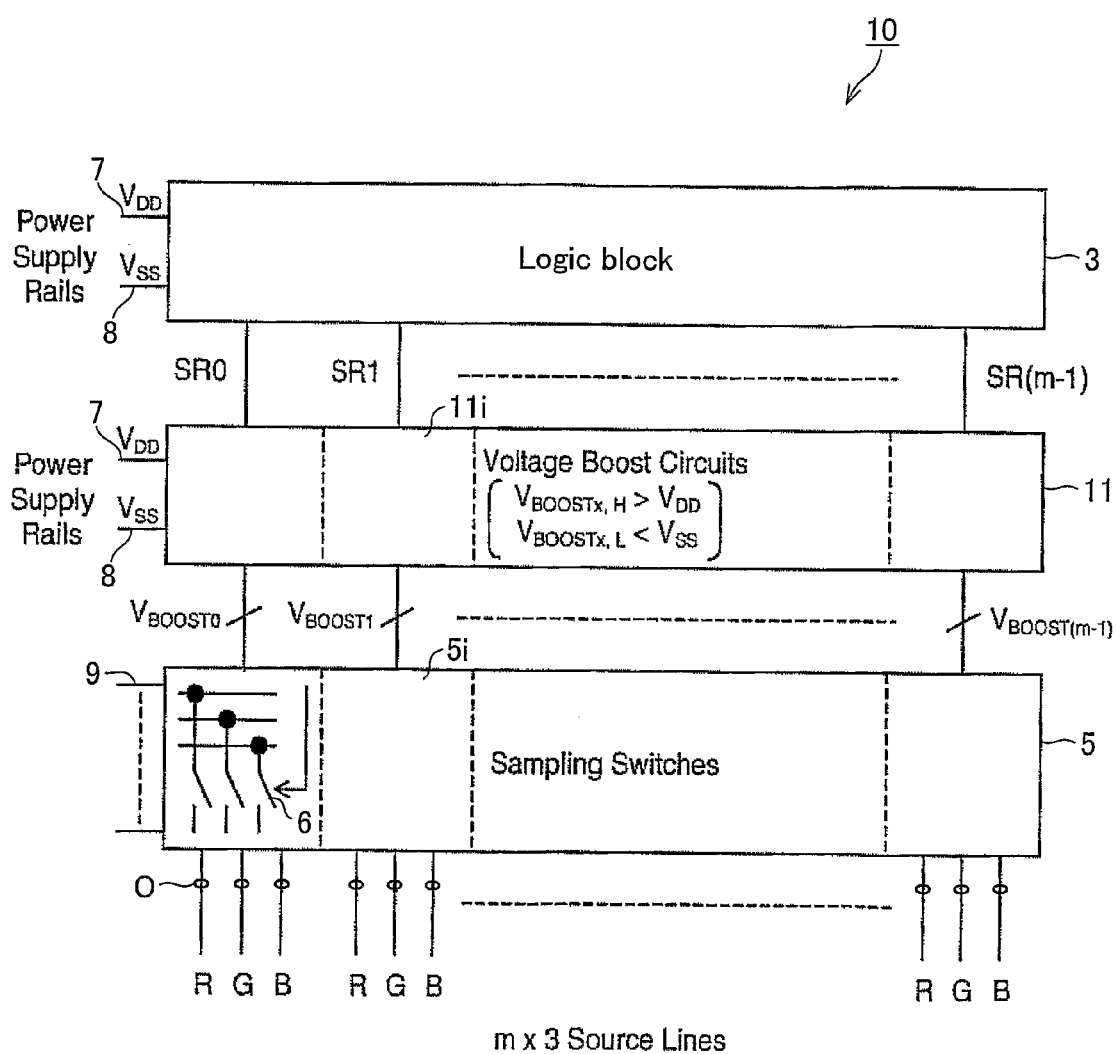
FIG. 8 is a block schematic diagram of a drive circuit of the present invention.

FIG. 8 is a block schematic diagram of a drive circuit 10 of the present invention In this embodiment the drive circuit is a source driver circuit for use in a display device such as an AMLCD, and each output O of the drive circuit is connected to a respective source line. The source driver 10 contains a logic block 3, a voltage booster 11 comprising a plurality of voltage boost circuits $11_i$ (where i=0, 1, 2 . . . (m−1)), and a sampler 5 comprising a plurality of sampling circuits $5_i$ (where i=0, 1, 2 . . . (m−1)). The logic block 3 is connected to first and second voltage supply lines 7, 8 which provide first and second supply voltages $V_{DD}$, $V_{SS}$ respectively. It will be assumed that $V_{DD}$>$V_{SS}$. The sampler 5 has input data lines 9 for receiving an analogue input (for example, an input data signal that defines an image to be displayed on a display device; the input data lines 9 may be video lines and the input data signal may be a video signal). Each sampling circuit $5_i$ samples the analogue input and provides, in dependence on the analogue input, an output signal that is fed to a respective output O. In the example of FIG. 8 each respective output is, as noted above, connected to a source line connected to the switching elements (e.g. transistors) of the $i^{th}$ column of pixels of the display device. (FIG. 8 shows a source driver for a full-colour display, so that each sampling circuit $5_i$ provides three output signals for a column of pixels, one for the red segment of the pixel addressed, one for the green segment of the pixel, and one for the blue segment of the pixel; the invention may also provide a source driver for a mono-chromatic display, in which case each of the sampling circuits $5_i$ would provide only a single output signal to each column of pixels.)

Each of the voltage boost circuits $11_i$ receive as its input the associated output SRi from the logic block 3. When the output SRi is "high" it will be equal to the first supply voltage $V_{DD}$, and when the output SRi is "low" it will be equal to the second supply voltage $V_{SS}$. The voltage boost circuits "boost" the input signal, and provide an output signal that is greater than the first supply voltage $V_{DD}$ (if SRi is "high") or that is less than the second supply voltage $V_{SS}$ (if SRi is "low"). As explained above, this allows the sampling switches 6 of the sampling circuits to be made smaller, thereby reducing the physical size of the sampling circuits; making the sampling switches smaller also reduce the capacitive loading of the video lines, thereby reducing the dynamic power consumed by the source driver.

Figure 2:
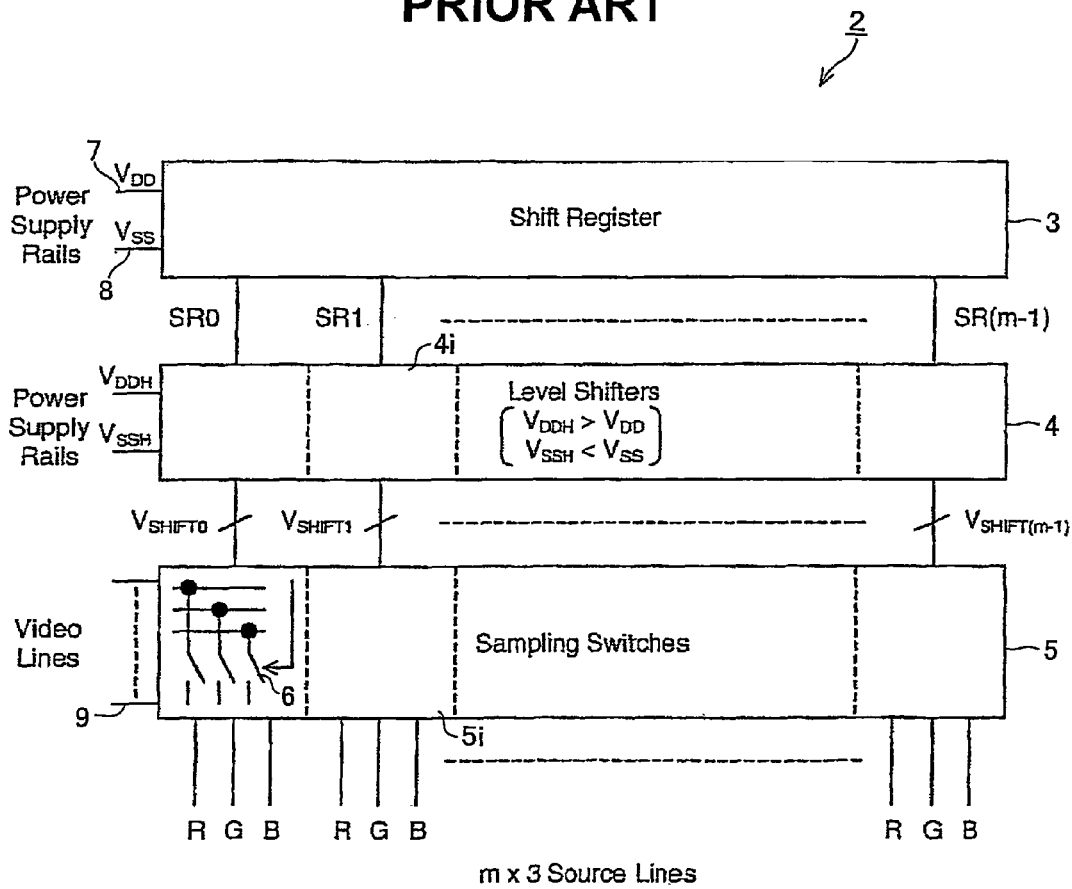
FIG. 2 is a block diagram of a typical source driver.
Figure 3:
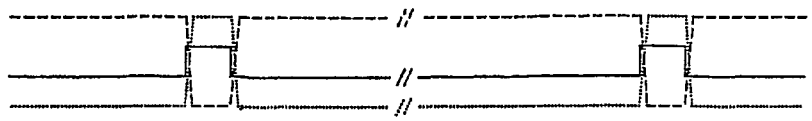
FIGS. 3(a) to 3(h) are timing diagrams for signals in the source driver of FIG. 2.
Figure 3:
Figure 3:
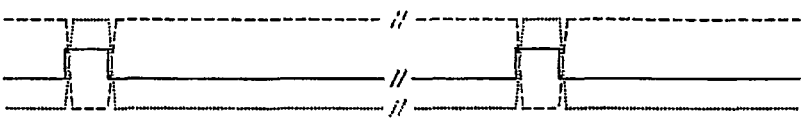
Figure 3:
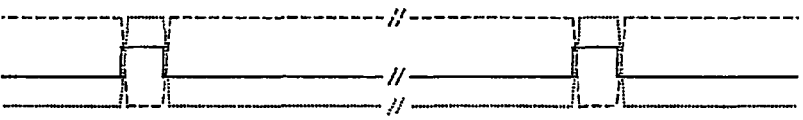
Figure 3:
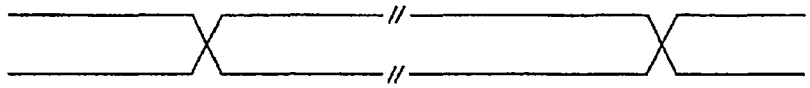
Figure 3:
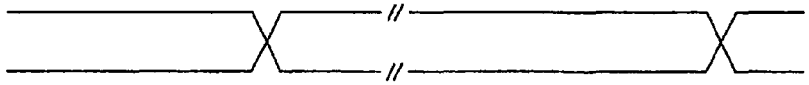
Figure 3:
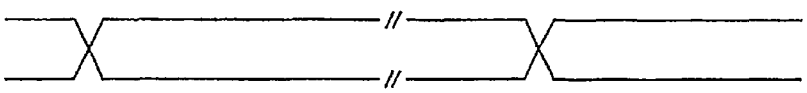
Figure 3:
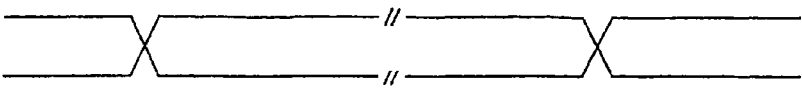
Figure 5:
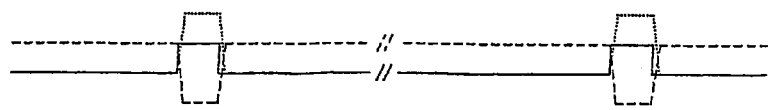
FIGS. 5(a) to 5(h) are timing diagrams for signals in the level shifter circuit of FIG. 4.
Figure 5:
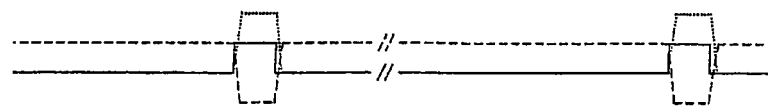
Figure 5:
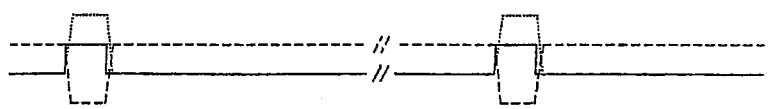
Figure 5:
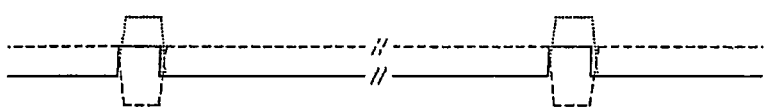
Figure 5:
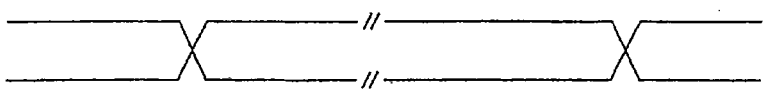
Figure 5:
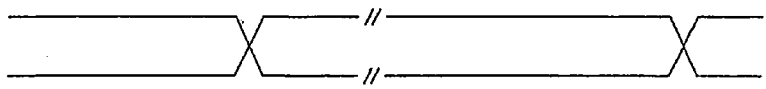
Figure 5:
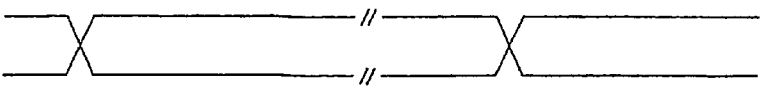
Figure 5:
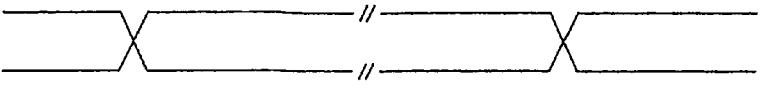
Figure 6:
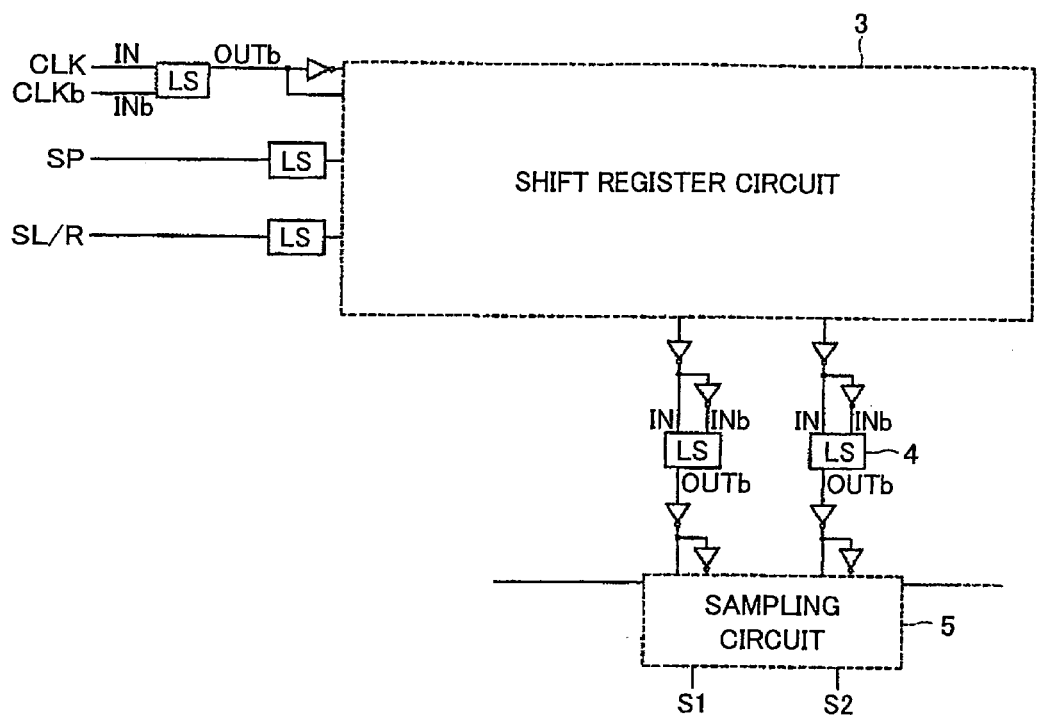
FIG. 6 shows a prior art source driver.
Figure 7:
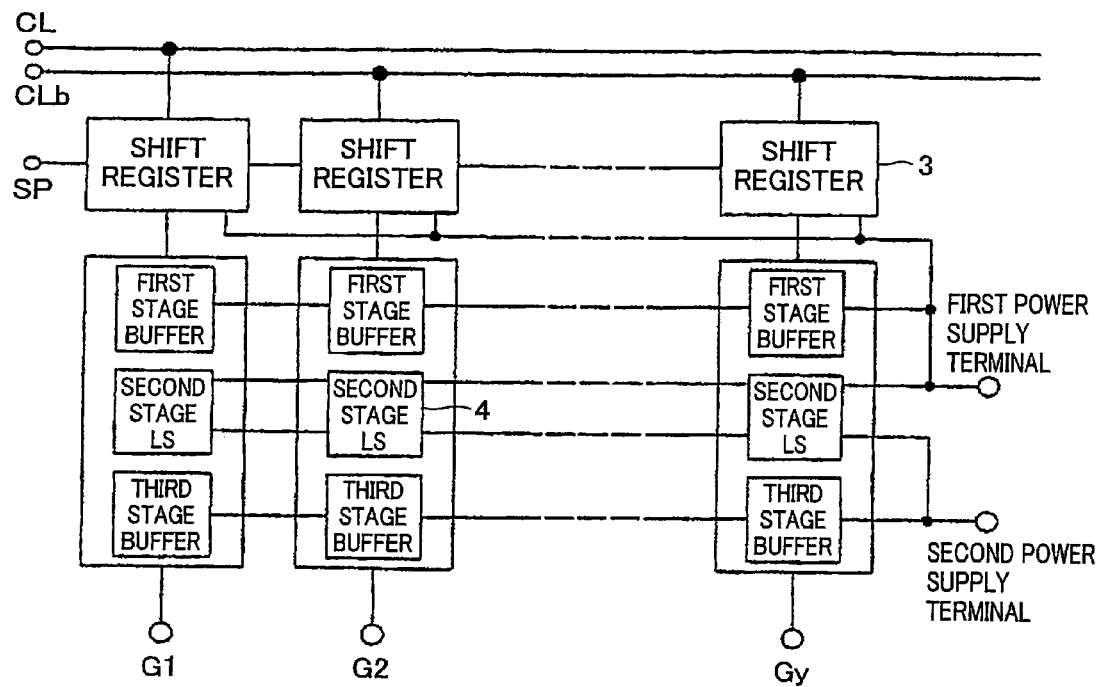
FIG. 7 shows a prior art source driver.

The voltage boost circuits $11_i$ are connected between the supply line 7 that supplies the first supply voltage $V_{DD}$ and the supply line 8 that supplies the second supply voltage $V_{SS}$— that is, the voltage boost circuits $11_i$ use the same supply voltages as the logic block 3. Conventional level shifters have high voltage invertors at their outputs to buffer the sampling pulses, but the voltage boost circuits 11 do not require these high voltage inverters. The elimination of the high voltage invertors reduces the power consumption. In addition, charge leakage in the voltage boost circuits 11 is low and this also contributes to a reduction in power consumption. The power consumption of voltage boost circuits is typically approximately 50% of the power consumption of conventional level shifters. Furthermore, the boosted voltages are usually high enough to allow the size of the TFTs in the sampling circuits to be reduced further, giving a reduction of approximately 20% in the dynamic power consumption associated with the video lines. Thus, the source driver 10 of the invention has a lower power consumption than the prior art source driver of FIG. 2.

Furthermore, since the voltage boost circuits $11_i$ use the same supply voltages as the logic block 3 the design of the source driver is simplified. There is no need to provide additional high voltage supply lines or control lines.

In the circuit of FIG. 8 the logic block 3 is a shift register. The invention is not, however, limited to use with a shift register but may be applied to other logic blocks.

FIG. 9(a) is a circuit diagram of one voltage boost circuit $11_i$ suitable for use in the drive circuit of FIG. 8 for driving n-type TFTs. (A circuit that is complementary to the circuit of FIG. 9(a) may be used for driving p-type TFTs.) The voltage boost circuit $11_i$ includes a boost capacitor 12, a first terminal of which is connected via a charging switch 13 to the supply line 7 that supplies the first supply voltage $V_{DD}$. The second terminal of the boost capacitor 12 is connected to ground via a second switch 14 or to the supply line 7 that supplies the first supply voltage $V_{DD}$ via a third switch 15. The first terminal of the boost capacitor 12 is connected via a fourth switch 16 to the output 17 of the boost circuit. The output 17 of the boost circuit is connected to ground via a fifth switch 18.

FIG. 9(a) also shows a sampling switch 6 of the associated sampling circuit $5_i$ with its gate G connected to the output 17 of the voltage boost circuit $11_i$. The sampling switch is shown as a transistor, with its drain connected to a video line for sampling an input voltage $V_i$ on the video line and with its source S connected to a source line $S_i$ to apply an output voltage $V_S$ to the source line $S_i$.

In operation, in a charging mode, as indicated by arrow 21, the first, second and fifth switches 13, 14, 18 are closed, while the third and fourth switches 15,16 are open. The first and second switches define a charging circuit, and cause current to flow from the supply line 7 for the first supply voltage ($V_{DD}$) through the first switch 13, the boost capacitor 12 and the second switch to ground thereby charging the capacitor 12 to the first supply voltage $V_{DD}$. In the charging mode the fifth switch 18 is also closed, thereby discharging the output 17 and the gate G of the sampling switch to ground.

In the boost mode, the first, second and fifth switches 13, 14, 18 are open, while the third and fourth switches 15,16 are closed. The second terminal of the boost capacitor is now connected to the first supply voltage $V_{DD}$ and that acts as a boost bias voltage. The second terminal of the boost capacitor is thus raised in potential, thereby raising the first terminal of the boost capacitor to a potential above first supply voltage $V_{DD}$. That voltage is applied to the output 17 of the voltage boost circuit as indicated by arrow 22. In the specific example of FIG. 9(*a*), the boost bias voltage is the first supply voltage $V_{DD}$ supply line 7 and so the first terminal of the boost capacitor is raised to a potential that will be approximately $2V_{DD}$ (but that will be below $2V_{DD}$ as a consequence of charge sharing between the boost capacitor and the capacitance of the gate of the sampling switch, and also as a consequence of charge leakage during switching).

The first to fifth switches may be MOS switches. They are actuated by timing signals T1, T2 having the form shown in FIG. 9(*b*) and provided by a mode selector circuit 20, with the first, second and fifth switches 13,14,18 being closed when the first timing signal T1 is "high" and the third and fourth switches 15,15 being closed when the second timing signal T2 is "high". (FIG. 9(*b*) shows the duration of the boost periods 24 as being relatively short compared to the duration of the charging periods, but the relative durations of these periods may be varied from those shown in FIG. 9(*b*).) A circuit of the type shown in FIG. 9(*a*) is described in U.S. Pat. No. 6,724,239.

Figure 10:
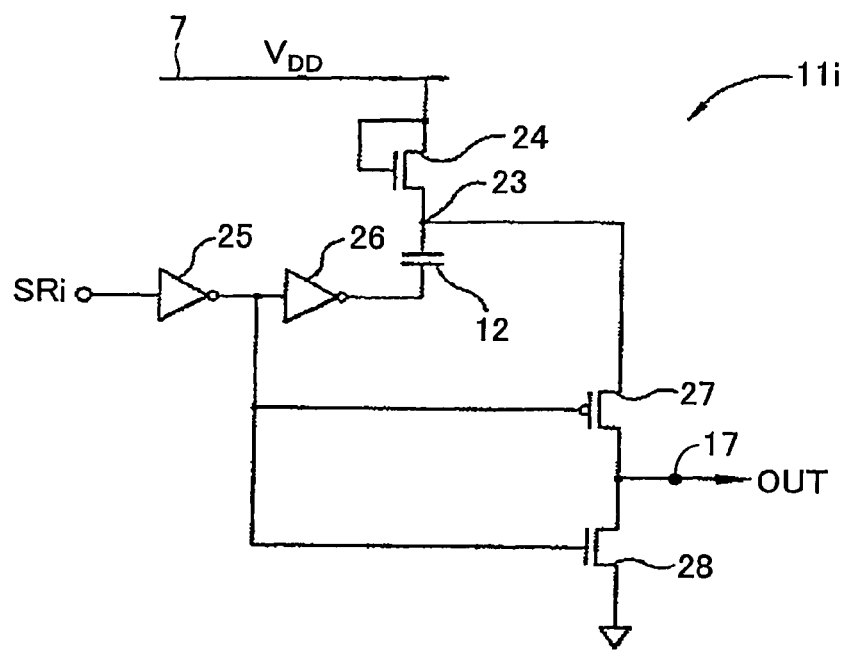
FIG. 10 shows another voltage boost circuit suitable for use in a drive circuit of the present invention.

FIG. 10 is a circuit diagram of another voltage boost circuit 11$_i$ suitable for use in the drive circuit of FIG. 8. A sampling switch 6 of a sampling circuit 5$_i$ may be connected to the output 17 of the voltage boost circuit.

The voltage boost circuit 11$_i$ again comprises a boost capacitor 12. While the output $SR_i$ from the shift register 3 is "low", the first terminal 23 of the boost capacitor 12 is charged to a voltage of ($V_{DD}-V_{tc}$), where $V_{tc}$ is the threshold voltage of a charging transistor 24 connected between the $V_{DD}$ supply rail 7 and the first terminal 23 of the boost capacitor 12. The charging transistor 24 is a diode connected transistor, in that its drain is connected to its gate, so that the charging transistor conducts only when the $V_{DD}$ supply rail 7 is higher than its drain potential by at least the threshold voltage $V_{tc}$.

The voltage boost circuit 11$_i$ of FIG. 10 further includes a pass switch 27 for connecting the first terminal 23 of the boost capacitor 12 to the output terminal 17, and a discharging switch 28 for connecting the output terminal 17 to earth. The discharging switch 28 is controlled to be open when the pass switch 27 is closed. In the circuit of FIG. 10 this is achieved by embodying one switch as a PMOS transistor and embodying the other switch as an NMOS transistor, and applying the same control signal to the gates of both transistors so that one transistor is on when the other is off. In FIG. 10 the pass switch 27 is embodied as a PMOS transistor and the discharging switch 28 is embodied as an NMOS transistor When the output $SR_i$ from the shift register 3 goes "high", the PMOS pass transistor 27 is turned on by a first inverter 25 whose output is connected to the gate of the PMOS pass transistor 27, thereby connecting the first terminal 23 of the boost capacitor 12 to the output 17 of the voltage boost circuit. The first inverter 25 also controls the gate of the NMOS discharging transistor 28 which is connected between the output 17 and ground potential so that when SRi is "high" the first inverter turns off the NMOS discharging transistor 28 to isolate the output 17 from ground potential.

The output from the first inverter 25 is connected via a second inverter 26 to the second terminal of the boost capacitor 12. The output of the second inverter 26 acts as a boost bias voltage so that, when the output $SR_i$ from the shift register 3 goes "high", the output of the second inverter 26 drives up the potential of the second terminal of the boost capacitor 12 and thereby drives the potential of the first terminal 23 of the boost capacitor 12 above its precharge value. The potential of the first terminal 23 of the boost capacitor 12, and thereby the potential at the output 17, can be driven to well above $V_{DD}$. (When the potential of the first terminal 23 of the boost capacitor 12 is boosted above $V_{DD}$, the charging transistor 24 switches off.)

When the output $SR_i$ from the shift register 3 subsequently goes "low", the output from the first inverter 25 turns on the NMOS discharging transistor 28, thereby connecting the output 17 to ground potential. At the same time, the PMOS pass transistor 27 is turned off, thereby isolating the output 17 of the voltage boost circuit from the first terminal 23 of the boost capacitor 12.

The charging transistor 24 may be an NMOS transistor.

In a modification of the embodiment, the charging transistor 24 may be replaced by a diode.

A circuit of the type shown in FIG. 10 is described in U.S. Pat. No. 6,330,196.

Figure 11:
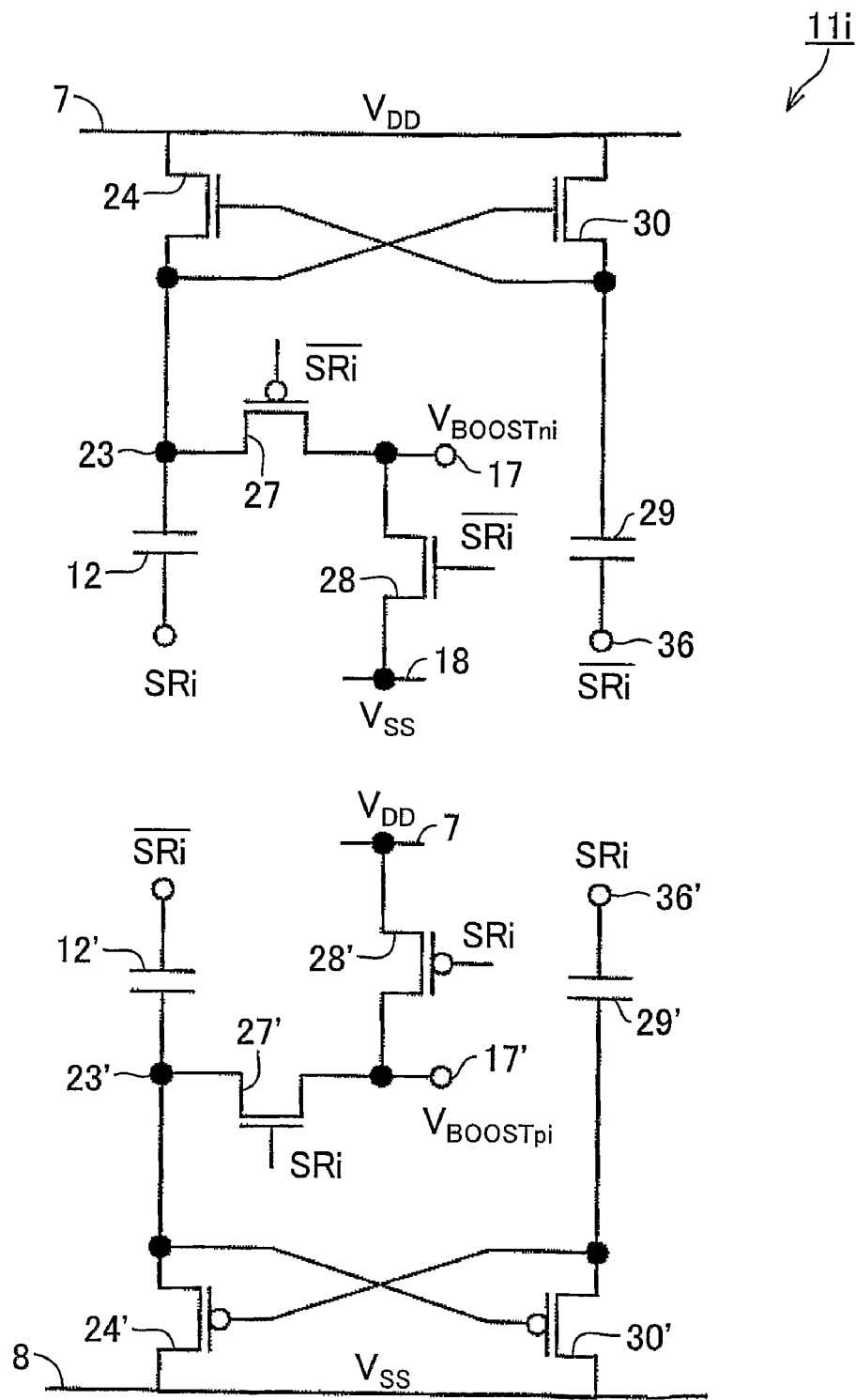
FIG. 11 shows another voltage boost circuit suitable for use in a drive circuit of the present invention.

FIG. 11 is a circuit diagram of another voltage boost circuit 11$_i$ suitable for use in the drive circuit of FIG. 8. A sampling switch 6 of a sampling circuit 5$_i$ may be connected to an output 17, 17' of the voltage boost circuit.

The operation of the top half of the voltage boost circuit of FIG. 11 is similar to the operation of the voltage boost circuit of FIG. 10. Compared with the circuit of FIG. 10, the NMOS device 24 charging the boost capacitor 12 is no longer configured as a diode—instead, an additional capacitor 29 and switch 30 control the gate voltage of the NMOS device 24 charging the boost capacitor 12. One terminal of the additional capacitor 29 is connected to the switch 30, and the other terminal of the additional capacitor 29 receives the signal $\overline{SRi}$, which is the inverse of the $i^{th}$ shift register output signal SRi, as input. The additional switch 30 is controlled by the potential at the first terminal 23 of the boost capacitor. In the embodiment of FIG. 11 the additional switch 30 is embodied as an NMOS device, and the gate of the additional NMOS device 30 is connected to the first terminal 23 of the boost capacitor. The gates of the PMOS pass transistor 27 and the NMOS discharging transistor 28 are each controlled by the signal $\overline{SRi}$ (where the signal $\overline{SRi}$ is "high" when the signal SRi is "low", and vice-versa).

When the output SRi from the shift register 3 is "low", the NMOS device 24 is switched on because a positive voltage is applied to its gate via the additional input 36, to which the signal $\overline{SRi}$ is applied, and the additional capacitor 29. The first terminal 23 of the boost capacitor 12 is charged up to the higher supply voltage $V_{DD}$ while the second terminal of the boost capacitor is at a low potential. The output 17 is connected to the supply rail 8 for the lower supply voltage $V_{SS}$ via the NMOS discharging transistor 28, which is turned on since its gate is driven by $\overline{SRi}$. The first terminal 23 of the boost capacitor 12 is isolated from the output 17 since the PMOS pass transistor 27 is off.

When the output SRi 33 from the shift register goes "high", the output $SR_i$ from the shift register 3 drives up the potential of the second terminal of the boost capacitor 12 and thereby drives the potential of the first terminal 23 of the boost capacitor 12 above its precharge value. The potential of the first terminal 23 of the boost capacitor 12, and thereby the potential at the output 17, can be driven to well above the higher supply voltage $V_{DD}$. When SRi goes "high", the NMOS discharging transistor 28 is turned off to isolate the output 17 from the supply rail 8 for the lower supply voltage $V_{SS}$, and the PMOS pass transistor 27 is turned on to connect the first terminal 23 of the boost capacitor to the output 17. Thus, an output voltage $V_{BOOSTni}$ that is well above the upper supply voltage $V_{DD}$ can be delivered to the output terminal 17 for operating an n-type sampling switch.

The bottom half of the voltage boost circuit $11_i$ of FIG. 11 is constructed and operates in a complementary manner to the upper half of the circuit. A component in the bottom half of the voltage boost circuit $11_i$ is identified by the same reference number as its complementary component in the upper half of the circuit, with the addition of an --'--. Thus, component 24' in the lower half of the voltage boost circuit is a PMOS device for connecting the first plate 23' of the boost capacitor 12' to the supply rail for the lower supply voltage $V_{SS}$.

When the output SRi from the shift register 3 is "low", the PMOS device 24' in the lower half of the circuit is switched on because a low voltage is applied to its gate via the additional input 36', to which the signal SRi is applied, and the additional capacitor 29', and the first terminal 23' of the boost capacitor 12' is charged to the lower supply voltage $V_{SS}$ while the second terminal of the boost capacitor is at a high potential. The output 17' of the lower half of the circuit is connected to the supply rail 7 for the higher supply voltage $V_{DD}$ via the PMOS discharging transistor 28', which is turned on since its gate is driven by SRi. The first terminal 23' of the boost capacitor 12' is isolated from the output 17' since the NMOS pass transistor 27' is off.

When the output SRi from the shift register goes "high", the output $SR_i$ from the shift register 3 drags down the potential of the second terminal of the boost capacitor 12' and thereby drags the potential of the first terminal 23' of the boost capacitor 12' below its precharge value. The potential of the first terminal 23' of the boost capacitor 12', and thereby the potential at the output 17', can be dragged down to well below the lower supply voltage $V_{SS}$. When SRi goes "high", the discharging transistor 28' is turned off to isolate the output 17' from the supply rail 7 for the higher supply voltage $V_{DD}$, and the pass transistor 27' is turned on to connect the first terminal 23' of the boost capacitor to the output 17'. Thus, the bottom half of the voltage boost circuit $11_i$ of FIG. 11 generates a "boosted" voltage $V_{BOOSTpi}$ that is below the lower supply voltage $V_{SS}$ and that is suitable for operating a p-type switch.

Figure 12:
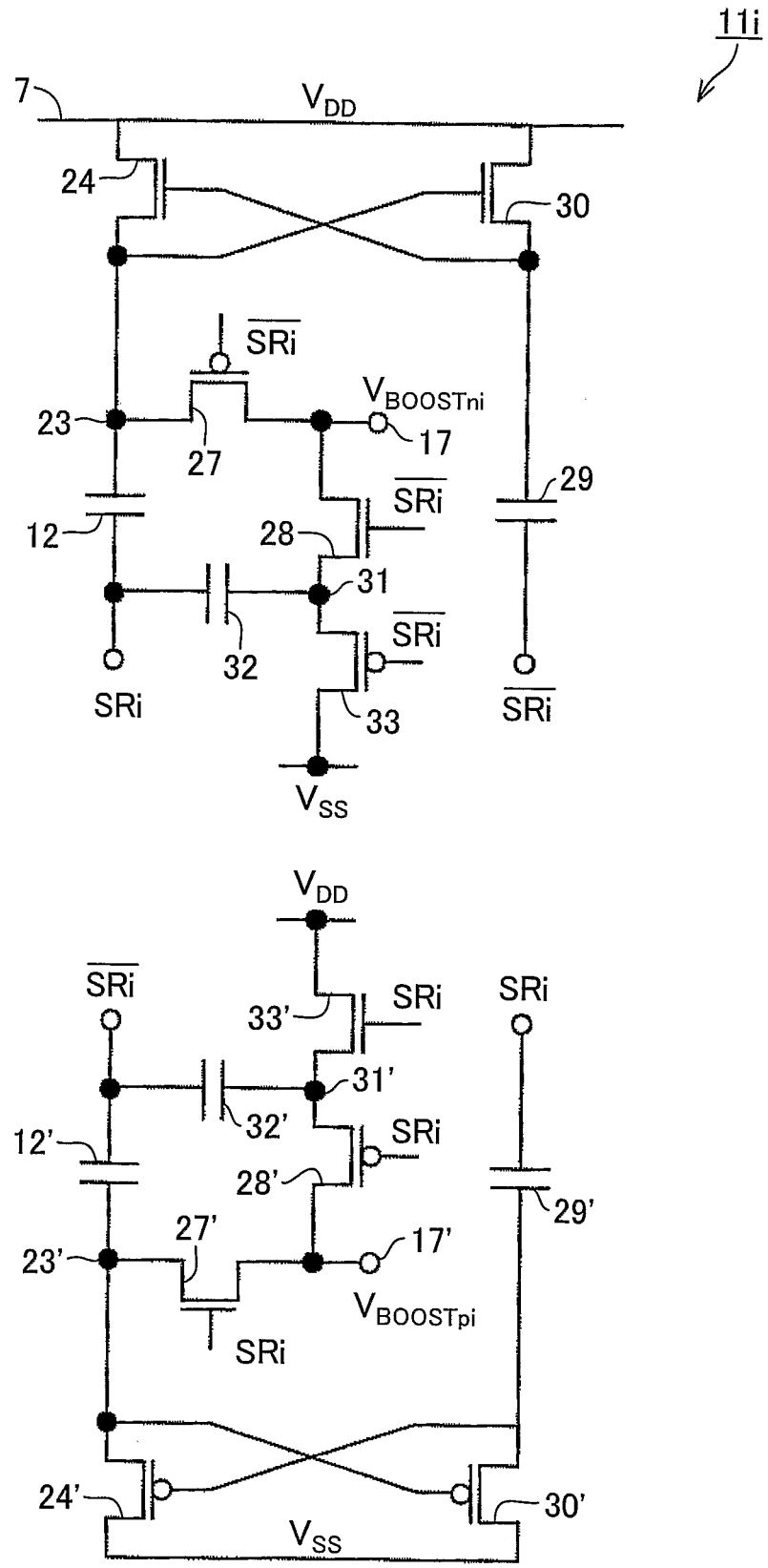
FIG. 12 shows another voltage boost circuit suitable for use in a drive circuit of the present invention.

FIG. 12 is a circuit diagram of another voltage boost circuit $11_i$ suitable for use in the drive circuit of FIG. 8. A sampling switch 6 of a sampling circuit $5_i$ may be connected to an output 17, 17' of the voltage boost circuit.

The top and bottom halves of the voltage boost circuit of FIG. 12 are similar to the top and bottom halves, respectively, of the voltage boost circuit of FIG. 11. Compared with the circuit of FIG. 11, the node 31 at the opposite side of the NMOS discharging transistor 28 is not connected directly to the supply rail 8 for the lower supply voltage $V_{SS}$ but is instead connected to the supply rail 8 for the lower supply voltage $V_{SS}$ by a further PMOS transistor 33; the node 31 is also connected via a further capacitor 32 to the second terminal of the boost capacitor 12.

When the output SRi of the shift register 3 is "low", the boost capacitor charges up as described with reference to FIG. 11 above.

When the output SRi from the shift register goes "high", the output $SR_i$ from the shift register 3 drives up the potential of the second terminal of the boost capacitor 12 and thereby drives the potential of the first terminal 23 of the boost capacitor 12 above its precharge value. The potential of the first terminal 23 of the boost capacitor 12, and thereby the potential at the output 17 of the upper half of the circuit, can be driven to well above the higher supply voltage $V_{DD}$ as described with reference to FIG. 11 above.

When the output SRi from the shift register is "high", the gate of the further PMOS transistor 33 is "low" (since the gate is controlled by $\overline{SRi}$), and the further PMOS transistor 33 is in a diode configuration (both gate and drain are connected to the lower supply voltage $V_{SS}$). Therefore, the further capacitor 32 is charged to $V_{DD}-V_{thp}$, where $V_{thp}$ is the threshold voltage of transistor 33. When the output SRi from the shift register goes "low" the further PMOS transistor 33 is turned off, and node 31 is boosted to a potential less than the lower supply voltage $V_{SS}$. This voltage is passed to the output 17 since the NMOS discharging transistor 28 is on (as its gate is controlled by $\overline{SRi}$). Thus, when the output SRi of the shift register is "low", the voltage at the output 17 of the upper half of the circuit will not be the lower supply voltage $V_{SS}$ but will be a voltage lower than the lower supply voltage $V_{SS}$.

The bottom half of the voltage boost circuit $11_i$ of FIG. 12 is constructed and operates in a complementary manner to the upper half of the circuit. A component in the bottom half of the voltage boost circuit $11_i$ is identified by the same reference number as its complementary component in the upper half of the circuit, with the addition of an --'--. When the output SRi from the shift register is "high", the bottom half of the voltage boost circuit $11_i$ of FIG. 12 generates a "boosted" voltage $V_{BOOSTpi}$ that is below the lower supply voltage $V_{SS}$ and that is suitable for operating a p-type switch. When the output SRi from the shift register is "low", the voltage at the output terminal 17' of the bottom half of the voltage boost circuit $11_i$ of FIG. 12 greater than the higher supply voltage $V_{DD}$. (When the output SRi from the shift register is "high", the gate of the further NMOS transistor 33' is "high" (since the gate is controlled by SRi), and the further NMOS transistor 33' is in a diode configuration (both gate and drain are connected to the upper supply voltage $V_{DD}$). Therefore, the further capacitor 32' is charged to $V_{DD}-V_{thn}$, where $V_{thn}$ is the threshold voltage of transistor 33'.)

Figure 1:
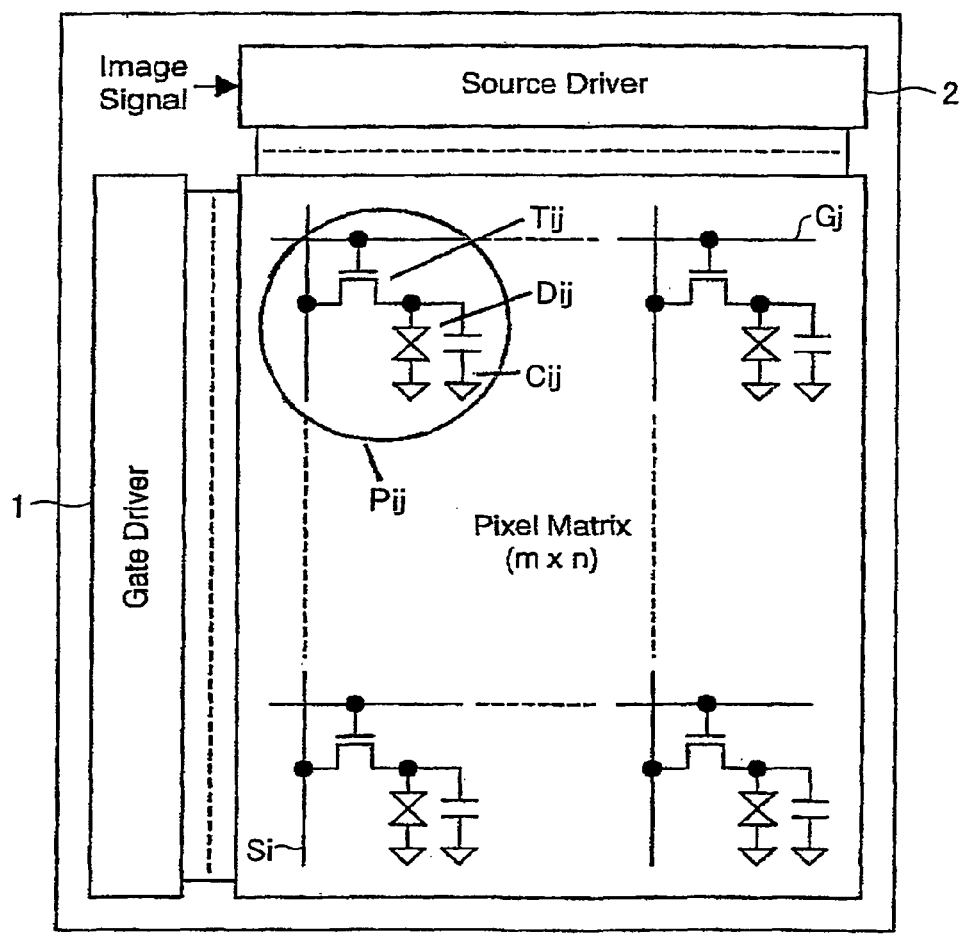
FIG. 1 shows a typical active matrix liquid crystal display.

A drive circuit 10 of the present invention may be incorporated on the substrate of the display device such as, for example, an active matrix display device. A drive circuit 10 of the present invention may replace the source driver 2 of the AMLCD of FIG. 1.

Figure 13:
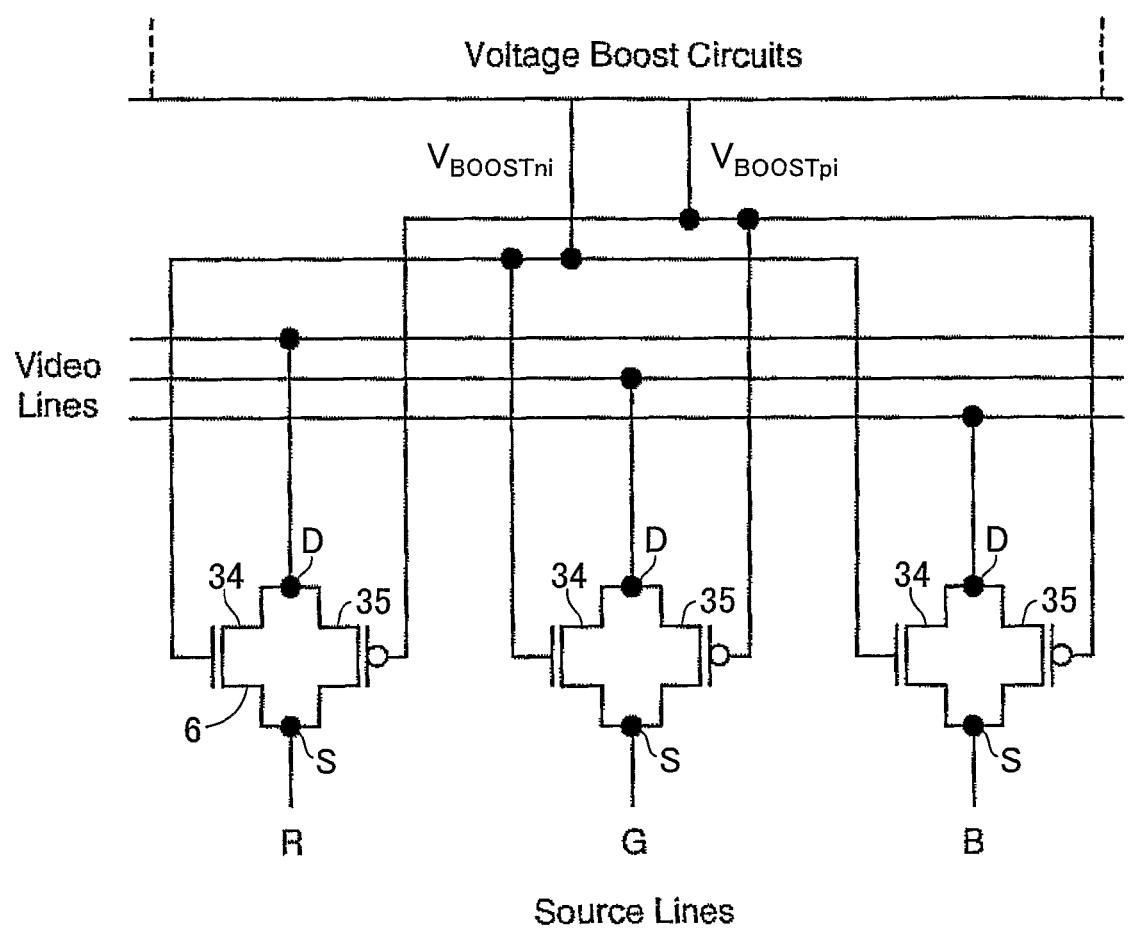
FIG. 13 is a schematic partial view of a source driver having sampling switches consisting of n-and p-type TFTs for one pixel column.

A drive circuit 10 of the present invention may have sampling circuits $5_i$ that contain sampling switches 6 that consist of both n-type TFTs and p-type TFTs. This is illustrated in FIG. 13, which is a partial view of a source driver according to the invention showing one sampling circuit $5_i$. As can be seen in FIG. 13, each sampling switch 6 consists of one n-type TFT 34 and p-type TFT 35. The source of the n-type TFT 34 is connected to the source of the p-type TFT 35 at node S, and the drain of the n-type TFT 34 is connected to the drain of the p-type TFT 35 at node D. Node D is connected to a video line, and node S is connected to a source line. FIG. 13 shows a sampling circuit for use with a full colour display so that each sampling circuit $5_i$ has three switches 6 to provide three output signals for a column of pixels, one for the red segment of the addressed pixel, one for the green segment of the pixel, and one for the blue segment of the pixel; the invention may also provide a source driver for a mono-chromatic display, in which case each of the sampling circuits $5_i$ would provide contain only a single switch 6 to provide a single output signal to each column of pixels.

The source driver of FIG. 13 require a voltage boost circuit that can provide both a voltage $V_{BOOSTni}$ that is greater than the higher supply voltage $V_{DD}$ and a voltage $V_{BOOSTpi}$ that is lower than the lower supply voltage $V_{SS}$. The voltage $V_{BOOSTni}$ that is greater than the higher supply voltage $V_{DD}$ is supplied to the gate of the n-type TFT 34, and the voltage $V_{BOOSTpi}$ that is lower than the lower supply voltage $V_{SS}$ is supplied to the gate of the p-type TFT 35. A voltage boost circuit as shown in FIG. 11 or 12 could, for example, be used in the source driver of FIG. 13, with the upper half of the circuit providing the voltage $V_{BOOSTni}$ to the gate of the n-type TFT 34 and the lower half of the circuit providing the voltage $V_{BOOSTpi}$ to the gate of the p-type TFT 35.

Figure 14:
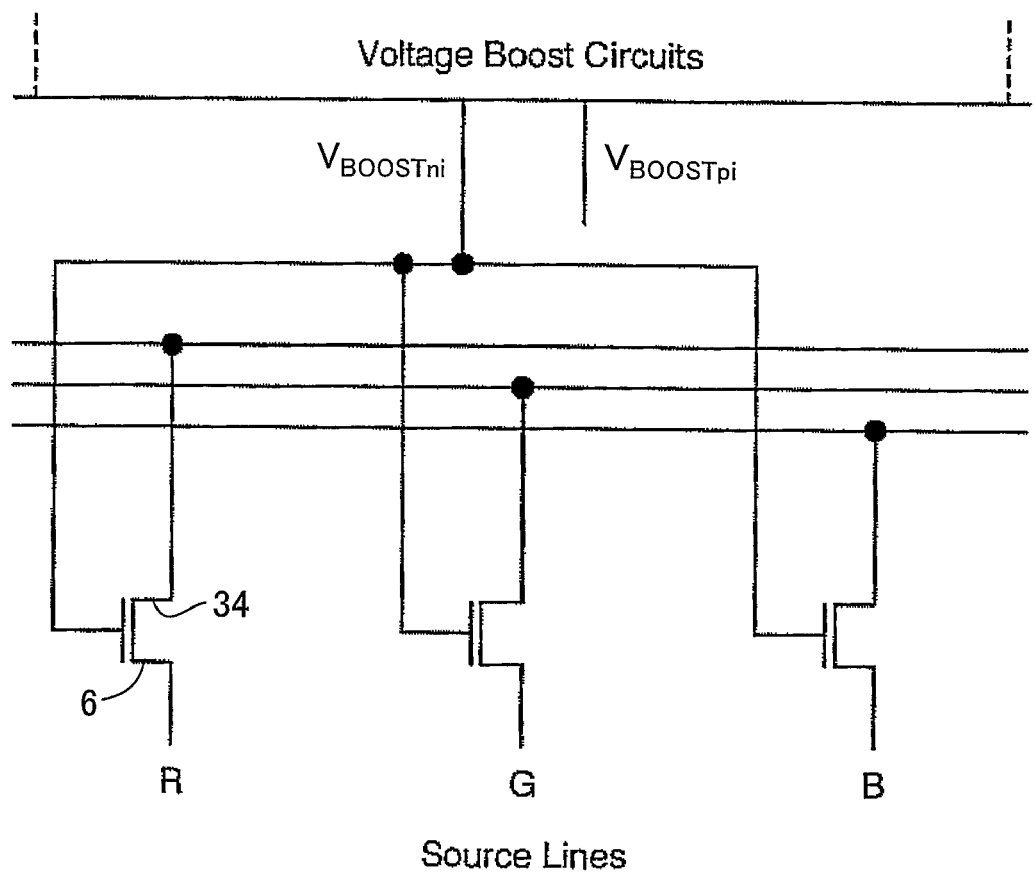
FIG. 14 is a schematic partial view of a source driver having sampling switches consisting only of n-type TFTs for one pixel column.

It is possible to construct voltage boost circuits that are complementary to the voltage boost circuits of FIGS. 9(a) and 10, and which provide a voltage $V_{BOOSTpi}$ suitable for switching a p-type TFT in a sampling circuit, where $V_{BOOSTpi}$ is lower than the lower supply voltage $V_{SS}$ A drive circuit 10 of the present invention may alternatively have sampling circuits $5_i$ that contain sampling switches 6 that consist only of n-type TFTs. This is illustrated in FIG. 14, which is a partial view of a source driver according to the invention showing one sampling circuit $5_i$. As can be seen in FIG. 14, each sampling switch 6 consists of one n-type TFT 34. The source of the n-type TFT 34 is connected to a source line, and the drain of the n-type TFT 34 is connected to a video line. FIG. 14 shows a sampling circuit for use with a full colour display so that each sampling circuit $5_i$ has three switches 6 to provide three output signals for a column of pixels, one for the red segment of the addressed pixel, one for the green segment of the pixel, and one for the blue segment of the pixel; the invention may also provide a source driver for a mono-chromatic display, in which case each of the sampling circuits $5_i$ would provide contain only a single switch 6 to provide a single output signal to each column of pixels.

The source driver of FIG. 14 require a voltage boost circuit that can provide a voltage $V_{BOOSTni}$ that is greater than the higher supply voltage $V_{DD}$, and this voltage $V_{BOOSTni}$ is supplied to the gate of the n-type TFT 34. A voltage boost circuit as shown in FIG. 9(a) or 10, or the upper half of a voltage boost circuit as shown in FIG. 11 or 12 could, for example, be used in the source driver of FIG. 14.

Figure 15:
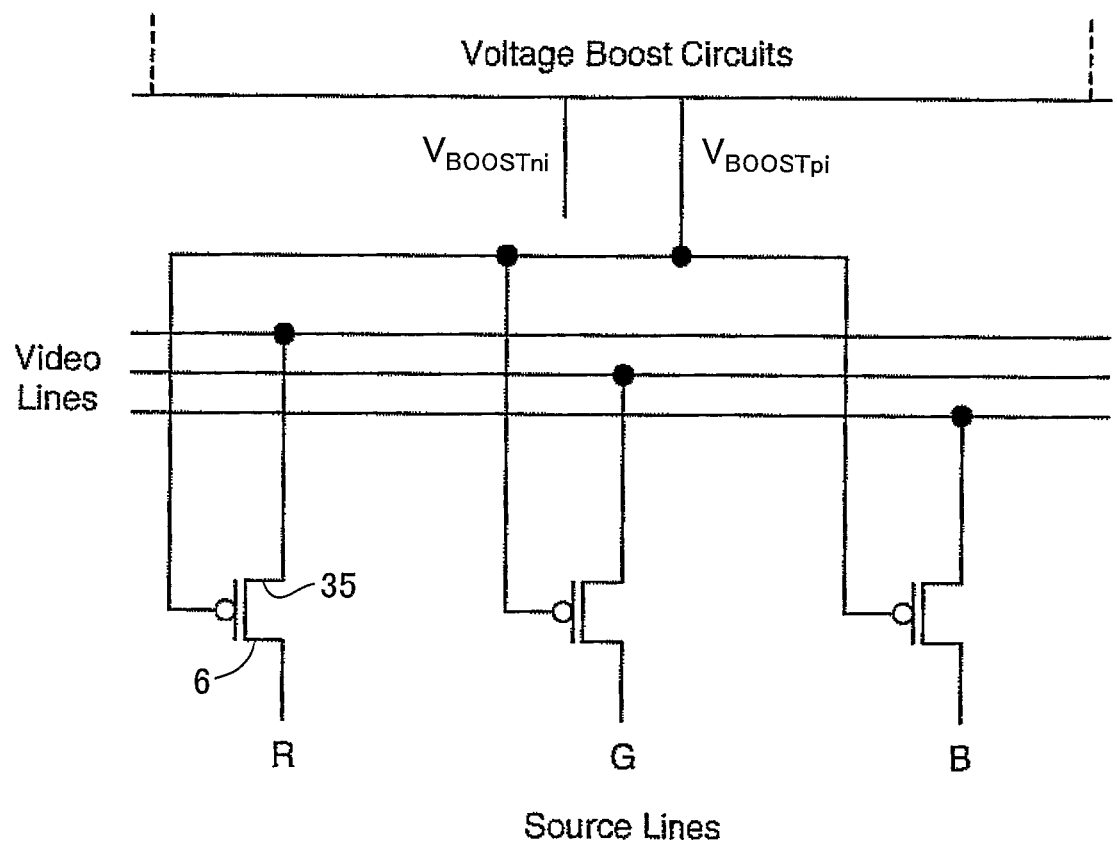
FIG. 15 is a schematic partial view of a source driver having sampling switches consisting only of p-type TFTs for one pixel column.

A drive circuit 10 of the present invention may alternatively have sampling circuits $5_i$ that contain sampling switches 6 that consist only of p-type TFTs. This is illustrated in FIG. 15, which is a partial view of a source driver according to the invention showing one sampling circuit $5_i$. As can be seen in FIG. 15, each sampling switch 6 consists of one p-type TFT 35. The source of the p-type TFT 35 is connected to a source line, and the drain of the p-type TFT 35 is connected to a video line. FIG. 14 shows a sampling circuit for use with a full colour display so that each sampling circuit $5_i$ has three switches 6 to provide three output signals for a column of pixels, one for the red segment of the addressed pixel, one for the green segment of the pixel, and one for the blue segment of the pixel; the invention may also provide a source driver for a mono-chromatic display, in which case each of the sampling circuits $5_i$ would provide contain only a single switch 6 to provide a single output signal to each column of pixels.

The source driver of FIG. 15 require a voltage boost circuit that can provide a voltage $V_{BOOSTpi}$ that is lower than the lower supply voltage $V_{SS}$, and this voltage $V_{BOOSTpi}$ is supplied to the gate of the p-type TFT 35. The lower half of a voltage boost circuit as shown in FIG. 11 or 12 could, for example, be used in the source driver of FIG. 15.

The embodiments of the invention described above are single-phase driver circuits. The invention is not, however, limited to a single-phase drive circuit but may be applied to an N-phase drive circuit where N>1.

The present invention may also be applied to a drive circuit that uses pre-charging to conserve power. Pre-charging increases the boosted voltages that can be provided, so that the size of the sampling switches can be reduced further thereby further reducing the power consumption. FIGS. 16(a) to 16(d) illustrate pre-charging for a single-phase (N=1) drive circuit. FIGS. 16(a) to 16(d) show voltage waveforms for application to the gates of sampling switches in, respectively, the first (i=0), second (i=1), penultimate (i=m 2) and last (i=m−1) sampling circuits. In each case, the three waveforms shown are the ith output SRi from the shift register (full line), the voltage applied to the gate of an n-type transistor included in sampling switches in the $i^{th}$ sampling circuit (dotted line), and the voltage applied to the gate of a p-type transistor included in sampling switches in the $i^{th}$ sampling circuit (broken line).

Figure 16:
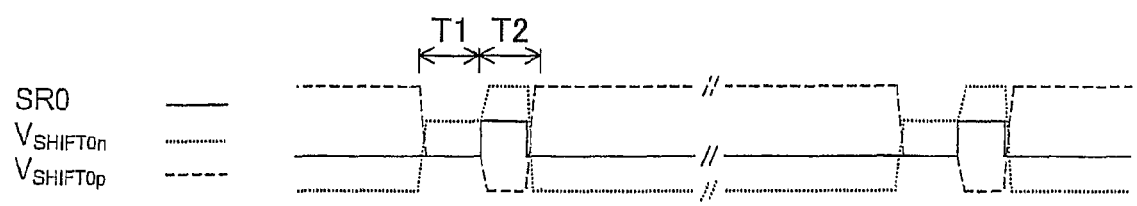
FIGS. 16(a) to 16(d) are timing diagrams for signals in a single-phase drive circuit of the present invention with pre-charging.
Figure 16:
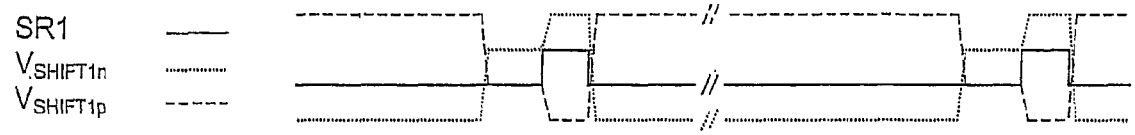
Figure 16:
Figure 16:

In time period T1, the SR(m−1) output from the shift register is "high" and all other outputs from the shift register are "low". The gates of the sampling switches of the $(m−1)^{th}$ sampling circuit are charged to their full voltages at the start of time period T1, as indicated by the waveforms of FIG. 16(d) representing the voltages applied to the gates of n-type and p-type transistors included in sampling switches in the $(m−1)^{th}$ sampling circuit. The voltage applied to the gate of an n-type transistor included in sampling switches in the $(m−1)^{th}$ sampling circuit is charged to it greatest value at the start of the time period T1, and the voltage applied to the gate of a p-type transistor included in sampling switches in the $(m−1)^{th}$ sampling circuit is charged to it lowest value at the start of the time period T1.

Also in the time period T1, the gates of the sampling switches of the next sampling circuit—namely the i=0 sampling circuit—are pre-charged to an intermediate voltage (e.g., the higher supply voltage $V_{DD}$ in a circuit intended to drive an n-type transistor or the lower supply voltage $V_{SS}$ in a circuit intended to drive a p-type transistor). This is shown in the waveforms of FIG. 16(a) representing the voltages applied to the gate of n-type and p-type transistors included in sampling switches in the i=0 sampling circuit.

Similarly, in the next time period T2 the gates of the sampling switches of the i=0 sampling circuit are charged to their full voltages at the start of time period T2, and the gates of the sampling switches of the next sampling circuit—namely the i=1 sampling circuit—are pre-charged to an intermediate voltage.

Pre-charging may also be applied in an N-phase drive circuit. For an N-phase system, whilst image data is sampled for N pixel columns in one time period, the gates of TFT sampling switches for the next N pixel columns are pre-charged to an intermediate voltage in the same time period. Once sampling for the first N pixel columns has been completed, the gates of TFT sampling switches for the next N pixel columns are driven to the full boost levels at the start of the next time period, and image data is sampled for these pixel columns. Also in this next time period, the gates of the TFT sampling switches for the next N pixel columns are pre-charged.

FIG. 17 shows a further voltage boost circuit suitable for use in a drive circuit of the invention. The voltage boost circuit of FIG. 17 can provide pre-charging. The voltage boost circuit of FIG. 17 is based on the voltage boost circuit of FIG. 11. The upper part of the voltage boost circuit of FIG. 17 includes a second pass switch 44 connected in parallel with the first pass switch 27 between the first terminal 23 of the boost capacitor 12 and the output 17. The second pass switch 44 is controlled so as to be closed for at least part of period in which the boost capacitor 12 is being charged up to a potential of the higher supply voltage $V_{DD}$ so that the output 17 is pre-charged. In the embodiment of FIG. 17 the second pass switch is a PMOS transistor. The gate of the second pass PMOS transistor 44 is controlled by the signal $\overline{SR(i-1)}$, which is the inverse of the $(i-1)^{th}$ output of the shift register.

The output of the upper part of the voltage boost circuit of FIG. 17 is isolated from the lower supply voltage $V_{SS}$ during both the $(i-1)^{th}$ and $i^{th}$ periods (i.e., the periods in which $(i-1)^{th}$ and $i^{th}$ outputs from the shift register are "high"). In the circuit of FIG. 17 this is achieved by providing a second discharging switch 45 connected in series with the first discharging switch 28 between the lower supply voltage $V_{SS}$ and the output 17, with the second discharging switch 45 arranged to be open when the $(i-1)^{th}$ output SR(i-1) of the shift register is "high". In FIG. 17 the second discharging switch 45 is embodied as an NMOS transistor, and the gate of the second NMOS discharging transistor 45 is controlled by the signal $\overline{SR(i-1)}$.

When the $i^{th}$ output SRi of the shift register is "low", the boost capacitor 12 is charged up to the higher supply voltage $V_{DD}$ as described with reference to FIG. 11. In the period when the $(i-1)^{th}$ output SR(i-1) of the shift register is "high", the second pass transistor 44 is closed so that the output 17 of the upper half of the circuit is connected to the first terminal 23 of the boost capacitor. Since the $i^{th}$ output SRi of the shift register is "low", the first terminal 23 of the boost capacitor is connected to the $V_{DD}$ supply rail 7 via the transistor 24; thus, the output 17 of the upper half of the circuit is pre-charged to the higher supply voltage $V_{DD}$.

When the $i^{th}$ output SRi of the shift register goes "high", the potential at the first terminal 23 of the boost capacitor is boosted above the higher supply voltage $V_{DD}$, as described with reference to FIG. 11 above. The second PMOS pass transistor 44 is now open but the first PMOS pass transistor 27 is closed, so that the first terminal 23 of the boost capacitor is connected to the output 17 of the upper half of the circuit and the boosted voltage is applied to the output 17.

The output 17 of the upper half of the circuit is isolated from the lower supply voltage $V_{SS}$ when either the $(i-1)^{th}$ output SR(i-1) of the shift register or the $i^{th}$ output SRi of the shift register is high, as one or other of the NMOS discharging transistors will be "off". If SR(i-1) and SRi are both low, both NMOS discharging transistors 28,45 will be "on" and the output 17 of the upper half of the circuit is connected to the lower supply voltage $V_{SS}$ supply.

The upper half of the voltage boost circuit of FIG. 17 thus provides an output voltage of the higher supply voltage $V_{DD}$ if the $(i-1)^{th}$ output SR(i-1) of the shift register is "high" to provide pre-charging, provides an output voltage boosted above the higher supply voltage $V_{DD}$ if the $i^{th}$ output SRi of the shift register is "high", and provides an output voltage of the lower supply voltage $V_{SS}$ otherwise.

The lower part of the voltage boost circuit of FIG. 17 similarly includes a second pass switch 44' connected in parallel with the first pass switch 27' between the first terminal 23' of the boost capacitor 12' and the output 17'. It also includes a second discharging switch 45' connected in series with the first discharging switch 28' between the $V_{DD}$ supply voltage and the output 17'. In the embodiment of FIG. 17 the second pass switch 44' is an NMOS transistor, and the second discharging switch 45' is a PMOS transistor. The gates of the second pass transistor 44' and the second discharging transistor 45' are controlled by the signal SR(i-1). The lower half of the voltage boost circuit of FIG. 17 can provide an output voltage of the lower supply voltage $V_{SS}$ if the $(i-1)^{th}$ output SR(i-1) of the shift register is "high" to provide pre-charging, an output voltage boosted below the lower supply voltage $V_{SS}$ if the $i^{th}$ output SRi of the shift register is "high", and provides an output voltage of the upper supply voltage $V_{DD}$ at other times.

The voltage boost circuit of FIG. 17 may be used in a single phase system or a multi-phase system. It may be used with a shift register that has overlapping outputs, or with a shift register for which only one shift register output is high at any time.

FIG. 18 shows a further voltage boost circuit suitable for use in a drive circuit of the invention. The voltage boost circuit of FIG. 18 can provide pre-charging. The voltage boost circuit of FIG. 18 is based on the voltage boost circuit of FIG. 11.

In the upper half of the voltage boost circuit of FIG. 18, the pass switch 27 and the discharging switch 28 are not controlled directly by an output signal from the shift register output, but are controlled by the output signal X from a logic circuit 54. The logic circuit 54 provides an output that turns the pass switch 27 on and the discharging switch 28 off if either one of the shift register output signals SR(i-1) and SRi is "high", and that turns the pass switch 27 off and the discharging switch 28 on otherwise. This allows the output 17 to be pre-charged when the shift register output signal SR(i-1) is "high".

In the circuit shown in FIG. 18, the pass switch 27 and the discharging switch 28 are embodied as a PMOS transistor and an NMOS transistor respectively. The logic circuit 54 thus provides an output that is "low" if either one of the shift register output signals SR(i-1) and SRi is "high" and that is "high" otherwise. The logic circuit 54 may be embodied as a NOR gate having as its inputs the shift register output signals SR(i-1) and SRi, as shown in FIG. 18.

Similarly, in the lower half of the voltage boost circuit of FIG. 18, the pass switch 27' and the discharging switch 28' are not controlled directly by an output signal from the shift register output, but are controlled by the output signal V from a second logic circuit 54'. The second logic circuit 54' provides an output signal V that turns the pass switch 27' on and the discharging switch 28' off if either one of the shift register output signals SR(i-1) and SRi is "high", and that turns the pass switch 27' off and the discharging switch 28' on otherwise. This allows the output 17' to be pre-charged when the shift register output signals SR(i-1) is "high".

In the circuit shown in FIG. 18, the pass switch 27' and the discharging switch 28' are embodied as an NMOS transistor and a PMOS transistor respectively. The logic second circuit 54' thus provides an output that is "high" if either one of the shift register output signals SR(i-1) and SRi is "high" and that is "low" otherwise. The logic circuit 54' may be embodied as a NAND gate having as its inputs the shift register output signals $\overline{SR(i-1)}$ and $\overline{SRi}$, as shown in FIG. 18.

A further embodiment of the invention uses charge sharing to conserve charge and power. For an N-phase system, the charge on the gates of TFT sampling switches for a set of N pixel columns are, once sampling for these N pixel columns has been completed, passed to the gates of TFT sampling switches for the following N pixel columns. The effect is that charge passes from one set of sampling switches to another, thereby providing a further reduction in power consumption.

Figure 19:
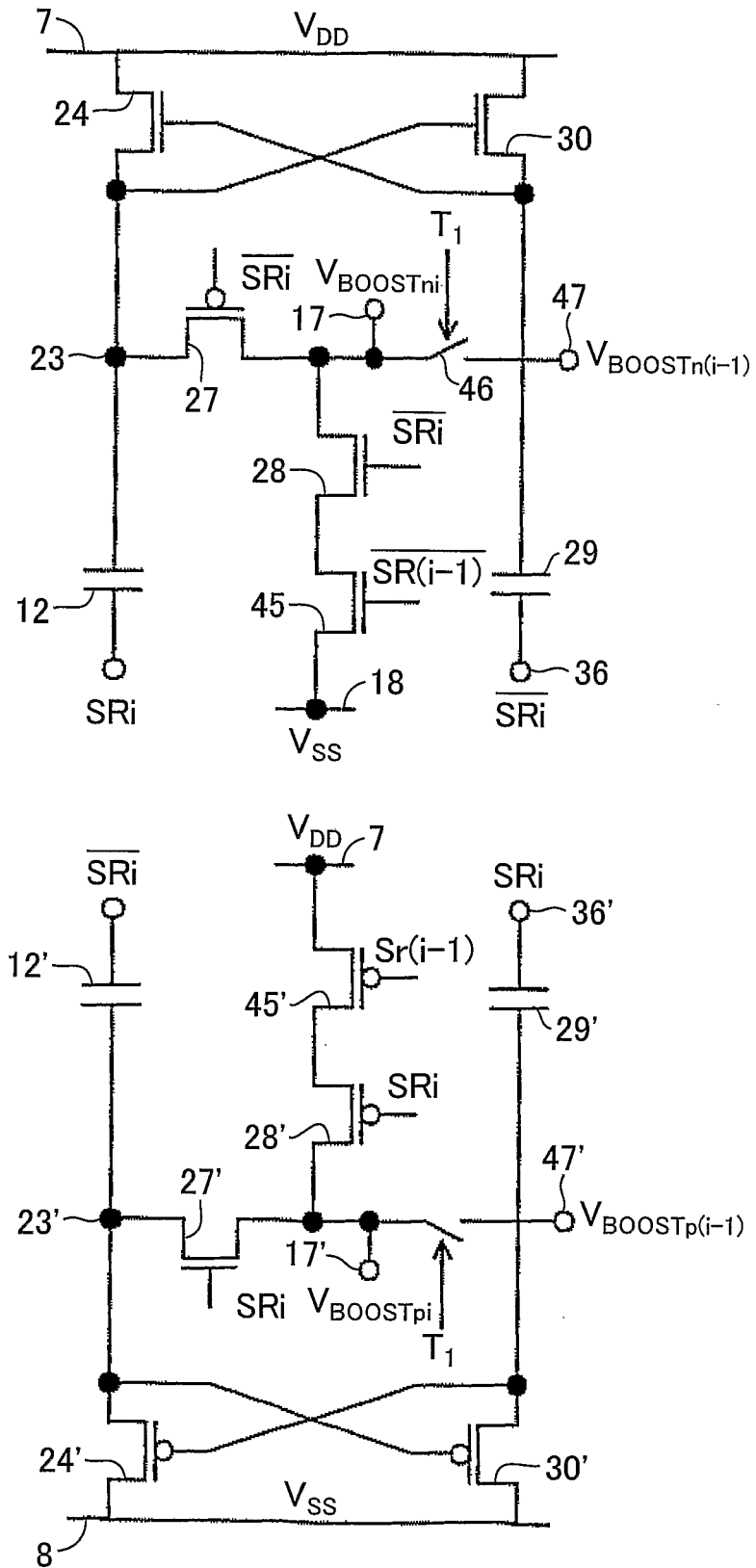
FIG. 19 shows another voltage boost circuit suitable for use in a drive circuit of the present invention.

FIG. 19 shows a further voltage boost circuit suitable for use in a drive circuit of the invention. The voltage boost circuit of FIG. 19 can provide charge sharing. The voltage boost circuit of FIG. 19 is based on the voltage boost circuit of FIG. 11, but the output 17 of the upper half of the circuit is connectable to the output 47 of the upper half of the voltage boost circuit driving a preceding source line (labelled "$V_{BOOSTn(i-1)}$" in FIG. 19). Similarly, the output 17' of the lower half of the circuit is connectable to the output 47' of the lower half of the voltage boost circuit driving the preceding source line (labelled "$V_{BOOSTp(i-1)}$" in FIG. 19). In FIG. 19 the outputs of the voltage boost circuit are connectable to the respective outputs of the immediately preceding source line, so that if the voltage boost circuit of FIG. 19 is for the $m^{th}$ source line the outputs 47,47' are the outputs of the voltage boost circuit for the $(m-1)^{th}$ source line.

It is necessary for the output 17 of the voltage boost circuit to be isolated from the lower supply voltage $V_{SS}$ in the $(i-1)^{th}$ or $i^{th}$ time periods. In the circuit of FIG. 19 this is achieved by providing the upper part of the voltage boost circuit with a second discharging switch 45 connected in series with the first discharging switch 28 between the lower supply voltage $V_{SS}$ supply and the output 17. The first and second discharging switches are arranged such that one of them is open in the $(i-1)^{th}$ time period and such that at least one of them is open in the $i^{th}$ time period. In the embodiment of FIG. 19 the second discharging switch 45 is embodied as a second NMOS transistor, and the gate of the second NMOS discharging transistor 45 is controlled by the signal SR $\overline{i-1}$. In this embodiment, the output 17 of the upper half of the circuit is connected to the $V_{SS}$ supply voltage unless either one of the $(i-1)^{th}$ output SR(i-1) of the shift register or the $i^{th}$ output SRi of the shift register is "high".

The output 17 of the upper half of the circuit is connected via a switch 46 to the output 47 of the upper part of the voltage boost circuit for the preceding source line (i.e., the (m-1) source line. The switch 46 is controlled by a control signal $T_1$ such that the switch 46 is closed for either all or part of the time period when the $(i-1)^{th}$ output SR(i-1) of the shift register is "high".

When the $i^{th}$ output SRi from the shift register is "low", the first terminal 23 of the boost capacitor 12 is connected the $V_{DD}$ supply line 7 via the transistor 24, as described above with reference to FIG. 11.

In the period when the $(i-1)^{th}$ output SR(i-1) of the shift register is "high", the output 17 of the upper half of the circuit is isolated from the lower supply voltage $V_{SS}$ since the second NMOS discharging transistor 45 is off. The switch 46 is controlled to be closed in the time period when the $(i-1)^{th}$ output SR(i-1) of the shift register is high, so that charge can pass from the output 47 of the upper part of the voltage boost circuit for the preceding source line to the output 17. (In the time period when the $(i-1)^{th}$ output SR(i-1) of the shift register is "high" a boosted voltage will be applied to the output 47 of the upper part of the voltage boost circuit for the preceding source line, so that the output 47 of the upper part of the voltage boost circuit for the preceding source line is at a higher potential than the output 17; charge will therefore flow to the output 17 from the output 47 of the upper part of the voltage boost circuit for the preceding source line.)

When the $i^{th}$ output SRi of the shift register is "high", a boosted output voltage is applied to the output 17 of the upper half of the circuit, as described above with reference to FIG. 11. The switch 46 is open so as to isolate the output 17 from the output 47 of the upper part of the voltage boost circuit for the preceding source line, but another switch (not shown) is closed so as to connect the output 17 to the output of the upper part of the voltage boost circuit (not shown) for the following source line (i.e., the $(m+1)^{th}$ source line). In this way, charge can pass along a row of pixels, from one set of sampling switches to the next.

The lower part of the voltage boost circuit of FIG. 19 is complementary to the upper half. It includes a second discharging switch 45' connected in series with the first discharging switch 28' between the $V_{DD}$ supply voltage and the output 17' of the lower part of the circuit. In FIG. 19 the second discharging switch is embodied as a PMOS transistor, and the gate of the second PMOS discharging transistor 45 is controlled by the signal SR(i-1). The output 17' of the lower half of the circuit is connectable via a switch 46' to the output 47' of the lower part of the voltage boost circuit for the preceding source line (i.e., the (m-1) source line. The switch 46 is controlled by the signal $T_1$. The output 17' of the lower half of the circuit is also connected via a switch (not shown) to the output of the lower part of the voltage boost circuit (not shown) for the following source line (i.e., the $(m+1)^{th}$ source line).

In FIG. 19 the output of a voltage boost circuit is connected to the output of the voltage boost circuit for an immediately preceding source line, so that the output of a voltage boost circuit for the $m^{th}$ source line is connectable to the output of the voltage boost circuit for the $(m-1)^{th}$ source line. In principle, the output of a voltage boost circuit need not be connected to the output of the voltage boost circuit for the immediately preceding source line; for example, the output of the voltage boost circuit for the $m^{th}$ source line could be connectable to the output of the voltage boost circuit for the $(m-2)^{th}$ source line.

Figure 20:
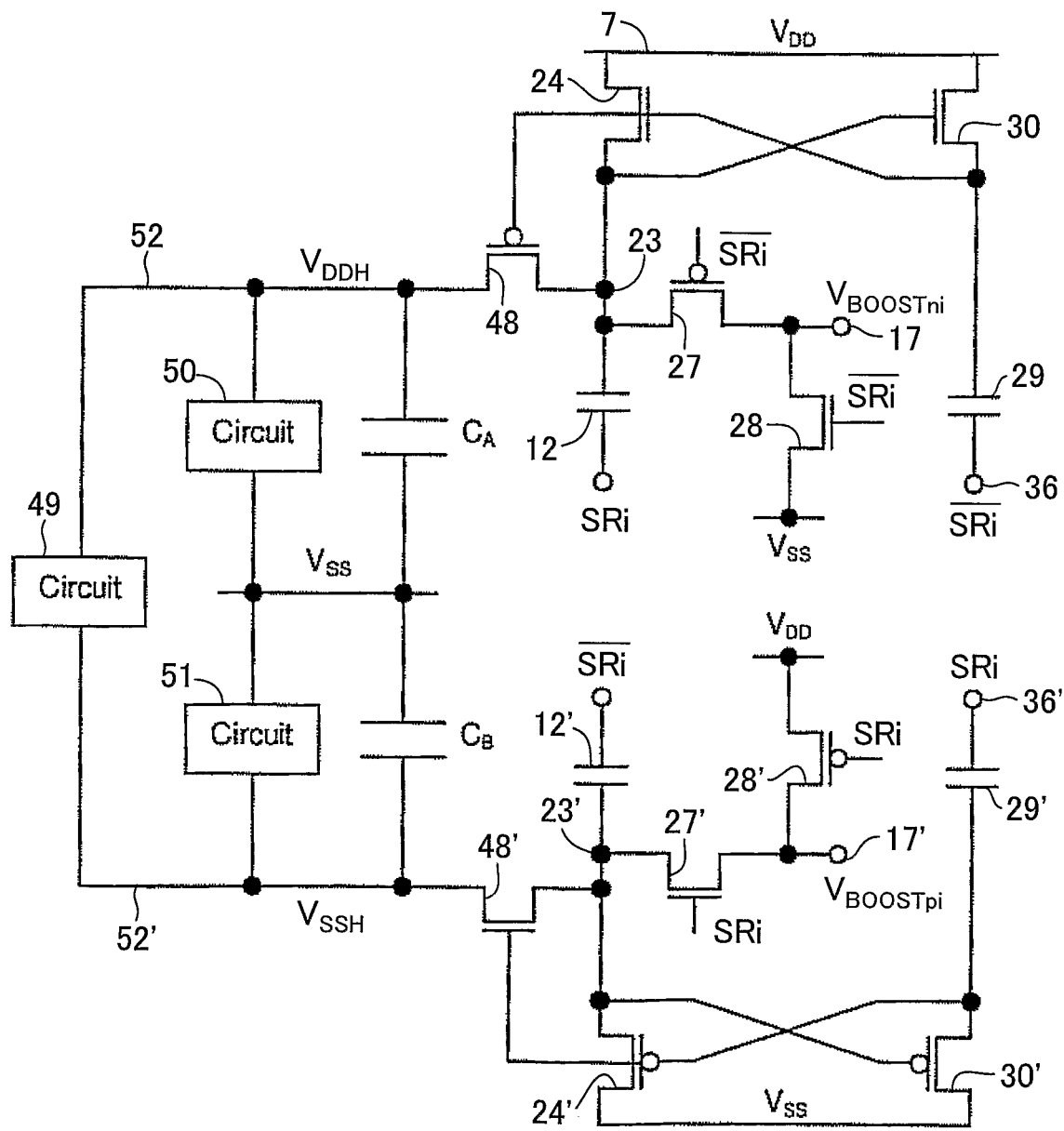
FIG. 20 shows another voltage boost circuit suitable for use in a drive circuit of the present invention.

FIG. 20 shows a further voltage boost circuit suitable for use in a drive circuit of the invention. The voltage boost circuit of FIG. 20 can, in addition to providing a boosted output voltage, also charge one or more reservoir capacitors. The reservoir capacitor(s) may be used to generate a high voltage (for example $V_{DDH}$) from the boosted output voltage $V_{boostni}$ and/or generate a low voltage (for example $V_{SSH}$) from the boosted output voltage $V_{boostpi}$, and supply the or each voltage to respective voltage supply rails 52,52'.

The voltage boost circuit of FIG. 20 is based on the voltage boost circuit of FIG. 11. The first terminal of the boost capacitor 12 in the upper half of the circuit is connected to a first voltage supply rail 52 via a switch 48. The switch 48 is arranged to be closed in the boost period in which the first terminal of the boost capacitor 12 is boosted above the supply voltage $V_{DD}$. In the circuit of FIG. 20, this is done by embodying the switch 48 as a PMOS device whose gate is controlled by the $i^{th}$ output signal $\overline{SRi}$ from the shift register. Thus, when the $i^{th}$ output SRi from the shift register goes "high" and the potential of the first terminal of the boost capacitor 12 is boosted above the higher supply voltage $V_{DD}$, in the manner described with reference to FIG. 11 above, the switch 48 is closed to connect the first terminal of the boost capacitor 12 to the first voltage supply rail 52, thereby supplying a boosted output voltage (for example $V_{DDH}$) to the first voltage supply rail 52. One or more storage capacitors $C_A$ are connected between the first voltage supply rail 52 and a fixed reference voltage, for example the lower supply voltage $V_{SS}$.

Similarly, the first terminal 23' of the boost capacitor 12' in the lower half of the voltage boost circuit of FIG. 20 is connected to a second voltage supply rail 52' via a switch 48'. The switch 48' is arranged to be closed when the first terminal 23' of the boost capacitor 12' is boosted below the lower supply voltage $V_{SS}$. In the circuit of FIG. 20, this is done by embodying the switch 48' as an NMOS device whose gate is controlled by the signal SRi. Thus, when the output SRi from the shift register goes "high" and the potential of the first terminal 23' of the boost capacitor 12' is boosted below $V_{SS}$, the switch 48' is closed to connect the first terminal 23' of the boost capacitor 12' to the second voltage supply rail 52', thereby supplying a boosted output voltage (for example $V_{SSH}$) to the second voltage supply rail 52. One or more storage capacitors $C_B$ are connected between the second voltage supply rail 52' and a fixed reference voltage, for example the lower supply voltage $V_{SS}$.

The storage capacitors $C_A, C_B$ maintain the first and second voltage supply rails 52,52' at the boosted voltages (eg, $V_{DDH}$, $V_{SSH}$) respectively. The voltage boost circuit of this embodiment can be said to act as a charge pump. The voltage supply rails 52,52' thus act as high voltage supply rails, and circuits to be driven may be connected between the first voltage supply rail 52 and the second voltage supply rail 52' as indicated at circuit 49, and/or between the first voltage supply rail 52 and the reference voltage (for example the lower supply voltage $V_{SS}$) as indicated at circuit 50, and/or between the second voltage supply rail 52' and the reference voltage (for example the lower supply voltage $V_{SS}$) as indicated at circuit 51.

Preferably, the voltage boost circuit for each source line is connected to the first and second voltage rails 52,52' in the manner shown in FIG. 20.

In principle, the voltage boost circuit of FIG. 20 could be provided with only the first voltage supply rail 52, the associated switch 48, and the associated storage capacitor $C_A$, or with only the second voltage supply rail 52', the associated switch 48', and the associated storage capacitor $C_B$.

FIG. 21 shows a further voltage boost circuit suitable for use in a drive circuit of the present invention. The voltage boost circuit of FIG. 21 has 2 m outputs, of which m outputs provide a boosted voltage greater than the higher supply voltage $V_{DD}$ and the other m outputs provide a boosted voltage less than the lower supply voltage $V_{SS}$. The voltage boost circuit is thus able to drive sampling switches associated with m source lines. However, the voltage boost circuit of FIG. 21 has only two boost capacitors 12, 12' (one in the upper half of the circuit and one in the lower half of the circuit).

The upper half of the voltage boost circuit of FIG. 21 comprises a boost capacitor 12, the first terminal 23 of which is connectable to the supply rail 7 for the upper supply voltage $V_{DD}$ by a switch 24. In the embodiment shown, the switch 24 that controls charging of the boost capacitor 12 is an NMOS device with gate voltage controlled by an additional capacitor 29 and NMOS device 30 as in FIG. 11.

The upper half of the voltage boost circuit of FIG. 21 further comprises a plurality of first control circuits $C_i$, where i=0, 1, 2, (m−1). Each of the first control circuits is for controlling the voltage applied to a respective output $O_i$ of the voltage boost circuit. Each first control circuit comprises a pass switch $P_i$ for connecting the first terminal 23 of the boost capacitor to the respective output and a discharging switch $N_i$ for connecting the respective output $O_i$ to a low voltage source, in this embodiment to the supply rail for the lower supply voltage $V_{SS}$. In the embodiment of FIG. 21, the pass switch $P_i$ is embodied as a PMOS transistor and the discharging switch $N_i$ is embodied as an NMOS transistor whose gate is controlled by the inverse $\overline{SRi}$ of $i^{th}$ output signal of the shift register.

The voltage applied to the gate of the PMOS pass transistor $P_i$ is supplied by a respective second control circuit $K_i$. Each second control circuit comprises a second pass switch $T_i$ for connecting the gate terminal of the respective PMOS pass transistor $P_i$ to the upper terminal 53 of the additional capacitor 29 and a second discharging switch $D_i$ for connecting the gate terminal of the respective PMOS pass transistor $P_i$ to a low voltage source, in this embodiment to the supply rail for the lower supply voltage $V_{SS}$. In the embodiment of FIG. 21, the second pass switch $T_i$ is embodied as a PMOS transistor whose gate is connected to the first terminal 23 of the boost capacitor and the second discharging switch $D_i$ is embodied as an NMOS transistor whose gate is controlled by the $i^{th}$ output SRi of the shift register.

A signal SRmux is applied to the second terminal of the boost capacitor 12. The signal SRmux is a multiplex of the individual output signals SR0 ... SR(m−1) from the shift register, so that SRmux is "high" if any one of the individual output signals SR0 ... SR(m−1) from the shift register is "high" and is "low" only if every one of the individual output signals SR0 ... SR(m−1) from the shift register is "low". More formally, the signal SRmux is given by SRmux=SR0 OR SR1 OR ... SR(m−1).

When all the outputs signals SRi from the shift register are "low", the transistor 24 is on since $\overline{SRmux}$ is high, and the first terminal of the boost capacitor 23 is charged to the higher supply voltage $V_{DD}$. When the $i^{th}$ output SRi from the shift register goes "high", the signal SRmux also goes "high", and the first terminal of the boost capacitor 12 is boosted above the higher supply voltage $V_{DD}$, in the manner described for previous embodiments. At this time, since the $i^{th}$ output SRi from the shift register is "high", the second discharging switch $D_i$ in the $i^{th}$ second control circuit $K_i$ is switched ON thereby causing the second control circuit $K_i$ to apply the lower supply voltage $V_{SS}$ to the gate of the PMOS pass transistor $P_i$ of the $i^{th}$ first control circuit $C_i$. As a result, the boosted voltage at the first terminal of the boost capacitor 23 is applied to the $i^{th}$ output $O_i$, as an output voltage $V_{boostni}$. The discharging transistor $N_i$ of the $i^{th}$ first control circuit $C_i$ is open, since its gate is controlled by $\overline{SRi}$ which is "low".

In the case of a shift register with non-overlapping outputs, only one of the output signals SRi is "high" at any one time. In this case, when the $i^{th}$ output SRi from the shift register is "high", the other outputs $O_j$, where j=0, 1 ... (m−1) except for j=i, are isolated from the first-terminal of the boost capacitor 23, so that the boosted voltage is applied only to the $i^{th}$ output $O_i$. In the embodiment of FIG. 21 this is achieved since in the $j^{th}$ second control circuit, where i≠j, the gate of the second pass switch $T_j$ is connected to the first terminal of the boost capacitor 23. So the second pass switch $T_j$ is only closed when SRmux is "low", i.e. when all shift register outputs are "low". During this time, the boosted voltage at the second terminal 53 of the additional capacitor 29 is applied to the gate of the first pass switch $P_j$ in the $j^{th}$ first control circuit $C_j$. When SRmux is "high" (i.e. when any shift register output is "high"), the second pass switch $T_j$ is open and the gate of the first pass switch $P_j$ in the $j^{th}$ first control circuit $C_j$ is floating. However, the boosted voltage previously on the gate of the first pass switch $P_j$ in the $j^{th}$ first control circuit $C_j$ is maintained by being stored in the parasitic capacitances of the gate of first pass switch $P_j$, and the first pass switch $P_j$ remains open. At the same time, the discharging transistor $N_j$ in the $j^{th}$ first control circuit is turned on since its gate is controlled by $\overline{SRj}$ which is high, so that the lower supply voltage $V_{SS}$ is applied to the $j^{th}$ output $O_j$.

The outputs SRi of the shift register are arranged to be "high" in sequence, and such that only one of the output signals is "high" at any one time. The upper part of the circuit of FIG. 21 will deliver an output voltage greater than the higher supply voltage $V_{DD}$ to each of the output terminals in sequence. For example, the shift register outputs are typically arranged such that SR0 is initially high, followed by SR1 high, followed by SR2 high, and so on in sequence, in which case a boosted output voltage will initially be provided to the output terminal $O_0$, then to the output terminal $0_1$, then to the output terminal $0_2$ and so on.

In the circuit of FIG. 21, it is necessary to turn off the pass transistor $P_i$ of the $i^{th}$ first control circuit $C_i$ when the $i^{th}$ output from the shift register goes "low". However, the first terminal of the boost capacitor 12 will still be at a boosted voltage while another output from the shift register is "high" so that SRmux remains "high". As a result in the circuit of FIG. 21, in which the pass transistor $P_i$ of the $i^{th}$ first control circuit $C_i$ is embodied as a PMOS device, it is necessary to apply a voltage greater than $V_{boost23} - V_{pT}$ to the gate of the pass transistor $P_i$ of the $i^{th}$ first control circuit $C_i$ in order to turn it off (where $V_{boost23}$ is the potential at the first terminal 23 of the boost capacitor and $V_{pT}$ is the threshold of the p-type pass transistor $P_i$). In the embodiment of FIG. 21, a sufficiently large gate voltage to turn off the pass transistor $P_i$ of the $i^{th}$ first control circuit $C_i$ is obtained by deriving the gate voltage from the upper terminal 53 of the additional capacitor 29 via the second pass switch $T_i$ of the $i^{th}$ second control circuit $K_i$.

The lower half of the voltage boost circuit of FIG. 21 is complementary to the upper half. One of the outputs $O'_i$ will provide an output voltage $V_{BOOSTp}$ which is lower than the lower supply voltage $V_{SS}$, with all other outputs providing an output of the higher supply voltage $V_{DD}$.

The voltage boost circuits of FIGS. 11, 12, 17, 19, 20 and 21 can provide both a voltage boosted above the higher supply voltage $V_{DD}$ (for driving n-type sampling switches) and a voltage boosted below the lower supply voltage $V_{SS}$ (for driving p-type sampling switches). In applications where it is necessary to drive only n-type sampling switches or to drive only p-type sampling switches, a voltage boost circuit of one of these embodiments may consist of only the upper portion or of only the lower portion.

The present invention has been described with reference to its application as a source driver circuit. However, a drive circuit of the invention is not limited to use as a source driver circuit but has other possible applications. For example, a drive circuit of the invention may be used in any application where it is desired to sample analogue references in a data converter.

Figure 22:
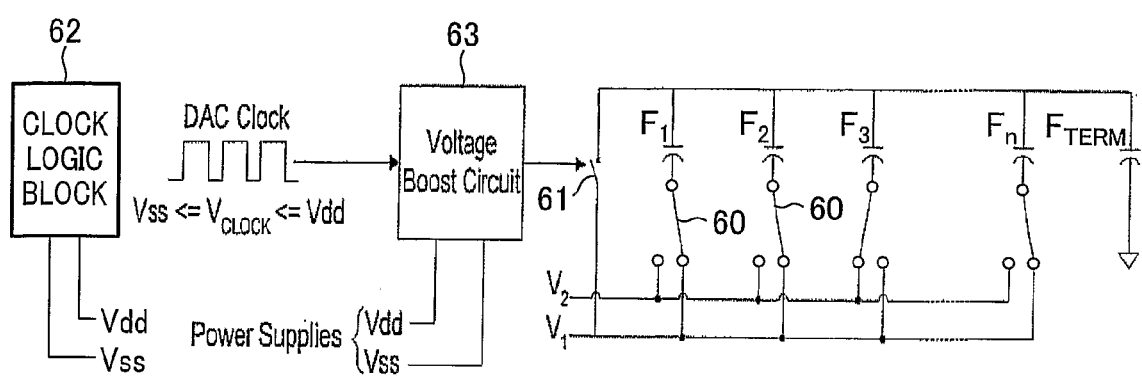
FIG. 22 shows another embodiment of the present invention.

As an example, FIG. 22 illustrates a drive circuit according to a further embodiment of the invention. This embodiment relates to a switched capacitor digital/analogue converter (DAC) for converting an n-bit digital word to a corresponding analogue output. The DAC comprises n capacitors $F_1, \ldots, F_n$ and further comprises a terminating capacitor $F_{TERM}$. The first electrodes of the capacitors $F_1, \ldots, F_n$ are connected together and to the first terminal of the terminating capacitor $F_{TERM}$. The second terminal of each of the capacitors $F_1, \ldots, F_n$ is connected to a respective switch, such as switch 60, which selectively connects the second electrode to a first or second reference voltage input $V_1$ or $V_2$ in accordance with the state or value of a corresponding bit of the digital word. The output of the DAC drives a load (not shown), for example in the form of a data line or column electrode of an active matrix of a liquid crystal device.

The DAC has two phases of operation, namely a resetting or "zeroing" phase and a converting or "decoding" phase, controlled by internally generated timing signals which are not illustrated in FIG. 22. During the zeroing phase, the first and second electrodes of the capacitors $F_1, \ldots, F_n$ and the first electrode of the terminating capacitor $F_{TERM}$ are connected together by an electronic switch 61 and to the first reference voltage input $V_1$. The capacitors $F_1, \ldots, F_n$ are therefore discharged so that the total charge stored in the DAC is equal to $V_1 F_{TERM}$.

During the decoding phase, the second electrode of each capacitor $F_i$ is connected to the first reference voltage input $V_1$ or to the second reference voltage input $V_2$ according to the value of the $i^{th}$ bit of the digital input word.

The electronic switch 61 is controlled by a clock signal that is generated by a clock logic block 62. The clock logic block is connected between a first power supply rail that provides a first supply voltage $V_{dd}$ and a second power supply rail that provides a second voltage $V_{ss}$ where $V_{dd} > V_{ss}$. The clock signal thus varies between a voltage level $V_{dd}$ and a voltage level $V_{ss}$.

During the zeroing phase the electronic switch 61 connects the upper plate of each capacitor to the first reference voltage $V_1$. The electronic switch has to charge all the capacitors quickly, and the requirements on the electronic switch 61 are therefore similar to the requirements for the sampling gates described above. It is therefore normal for the electronic switch 61 to have a large area, and/or to operate on voltage supply rails that provide a voltage greater than the first supply voltage $V_{dd}$ and a voltage lower than the second supply voltage $V_{ss}$. As in the case of the shift register described above, this is unsatisfactory. Making the electronic switch 61 large presents a large parasitic capacitance to the DAC and affects its operation, whereas operating the electronic switch 61 at a high voltage consumes more power and requires the provision of additional voltage supply rails.

According to the embodiment of FIG. 22, therefore, the clock signal from the clock logic block is boosted by a voltage boost circuit 63 that increases the level of the clock signal so that the clock signal supplied to the electronic switch 61 varies between a voltage level $V_{ddh}$ and a voltage level $V_{ssh}$, where $V_{ddh} > V_{dd} > V_{ss} > V_{ssh}$. The voltage boost circuit 63 uses the same voltage supply rails as the clock logic block 61 (i.e., the first power supply rail $V_{dd}$ and the second power supply rail $V_{ss}$), so that power consumption is reduced and the need to provide additional voltage supply rails is eliminated.

The electronic switch 61 may be either a single channel switch or a complementary switch, as described above.

Figure 23:
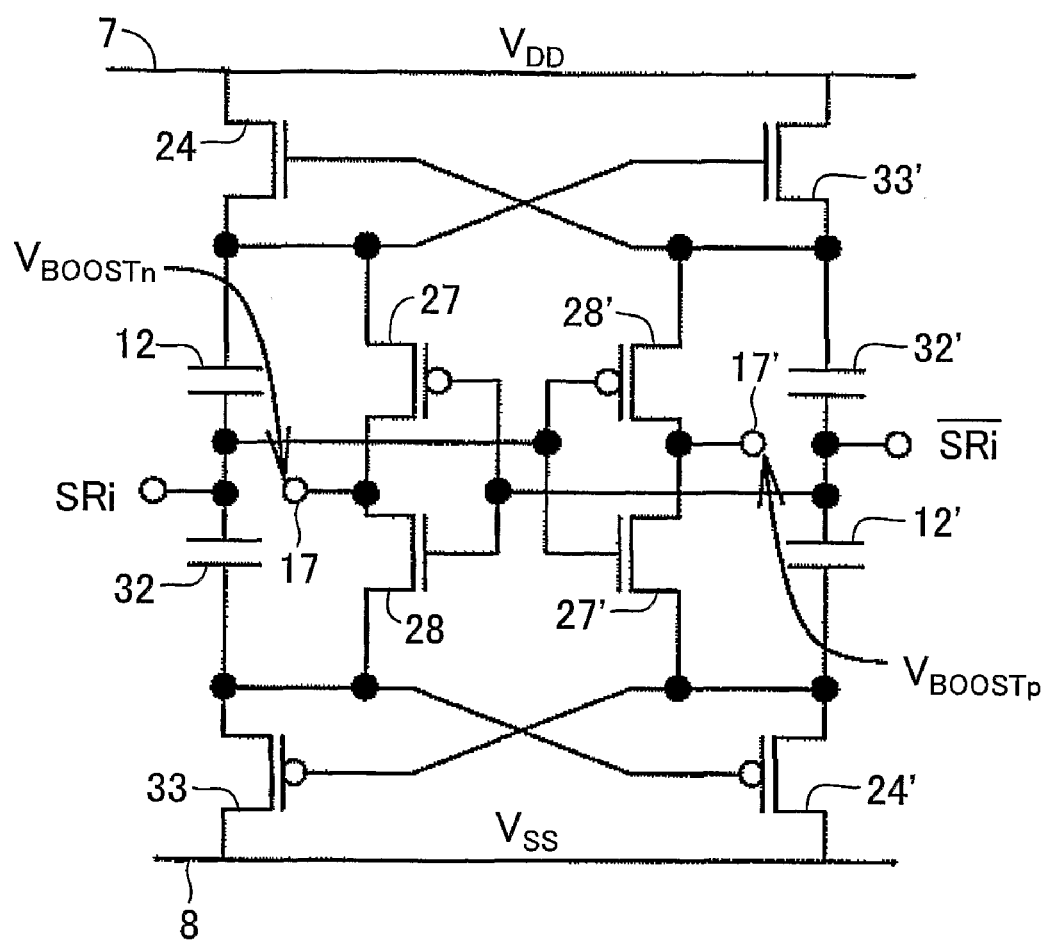
FIG. 23 shows another voltage boost circuit suitable for use in a drive circuit of the present invention.

FIG. 23 shows a further voltage boost circuit suitable for use in a drive circuit of the present invention. As described for the voltage boost circuit of FIG. 12, the voltage boost circuit of FIG. 23 can, when the output SRi of the shift register is "low", provide a voltage at the $V_{boostn}$ output 17 that is lower than the lower supply voltage $V_{SS}$ (in addition to, when the output SRi of the shift register is "high", providing a voltage at the $V_{boostn}$ output 17 that is higher than the higher supply voltage $V_{DD}$). Conversely, the voltage boost circuit of FIG. 23 can provide at the $V_{boostp}$ output 17' a voltage that is lower than the lower supply voltage $V_{SS}$ (when the output SRi of the shift register is "high") and a voltage that is higher than the higher supply voltage $V_{DD}$ (when the output SRi of the shift register is "low")

Providing an output voltage at the $V_{boostn}$ output 17 that is lower than the lower supply voltage $V_{SS}$ when the output SRi of the shift register is "low" ensures that, when the output voltage is used to control n-type TFT sampling switches, the n-type TFT sampling switches are OFF in applications in which the sampled voltages exceed the supply voltages during periods of no sampling (i.e., when the output SRi of the shift register is "low"). Conversely, providing an output voltage at the $V_{boostp}$ output 17' that is higher than the higher supply voltage $V_{DD}$ when the output SRi of the shift register is "low" ensures that, when the output voltage is used to control p-type TFT sampling switches, the p-type TFT sampling switches are OFF during periods of no sampling.

The voltage boost circuit of FIG. 23 is a more efficient implementation of the voltage boost circuit of FIG. 12, particularly in applications that require both $V_{BOOSTn}$ and $V_{BOOSTp}$. As can be seen, the transistors 30,30' and the additional capacitors 29,29' of FIG. 12 have been eliminated. A further advantage is that the gates of the switches 33 and 33' in FIG. 23 are driven by the ON voltages of $V_{BOOSTp}$ and $V_{BOOSTn}$ respectively (where the "ON voltage" denotes the voltage at the output terminals 17,17' when the output SRi of the shift register is "high"), allowing the capacitors 32 and 32' to be fully charged.

FIG. 20 above shows the boosted ON voltages being used to charge reservoir capacitors, which are used to generate high voltage supply rails $V_{DDH}$ and $V_{SSH}$. In the case of a voltage boost circuit which produces boosted OFF voltages (where the "OFF voltage" denotes the voltage at the output terminals 17,17' when the output SRi of the shift register is "low")—as in the voltage boost circuits of FIG. 12 or 23—either the boosted ON voltages or the boosted OFF voltages can be used to charge reservoir capacitors and/or generate high voltage supply rails $V_{DDH}$ and $V_{SSH}$.

Figure 24:
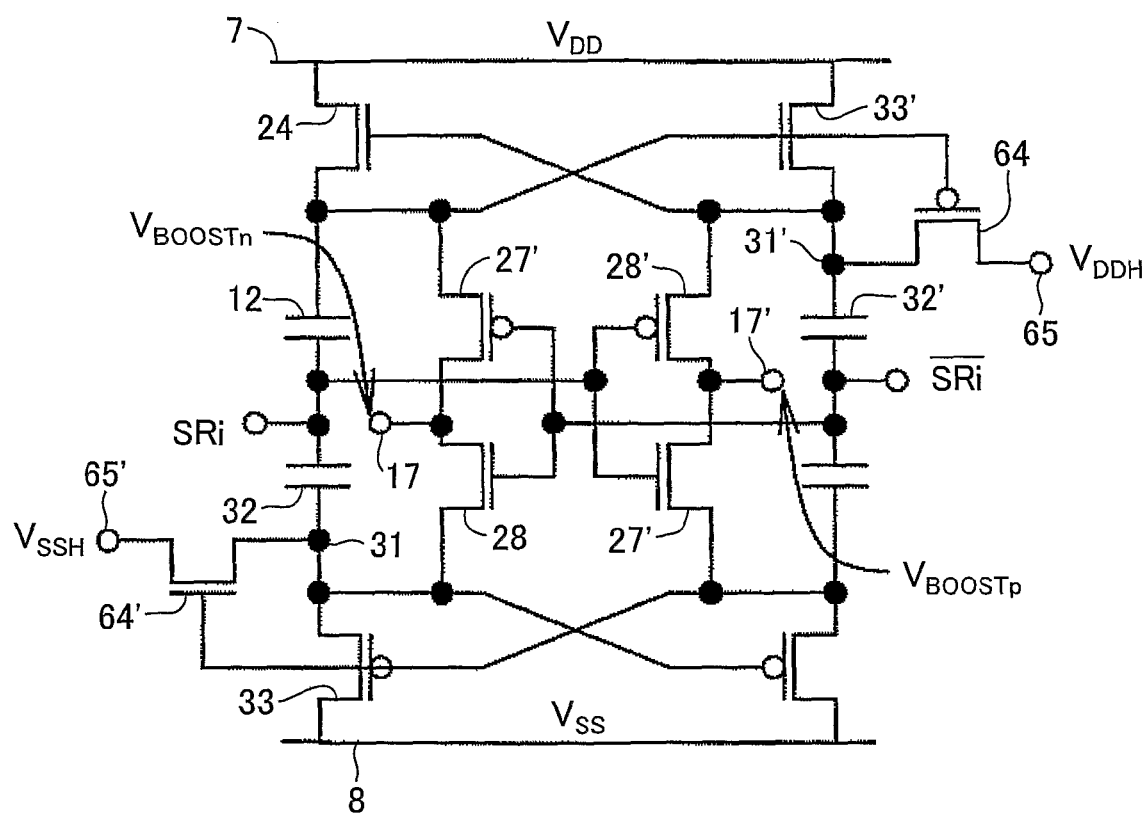
FIG. 24 shows another voltage boost circuit suitable for use in a drive circuit of the present invention.

FIG. 24 shows how the boosted OFF voltages generated by the voltage boost circuit of FIG. 23 may be used to generate the boosted voltages $V_{DDH}$ and $V_{SSH}$. The voltage boost circuit of FIG. 24 corresponds to the voltage boost circuit of FIG. 23, except that it further comprises a switch 64 connected at one end to the node 31' between the transistor 33' and the capacitor 32', and a switch 64' connected at one end to the node 31 between the transistor 33 and the capacitor 32. The switches 64, 64' are arranged to be open when the output SRi of the shift register is "low"—in the embodiment of FIG. 24 the switch 64 is embodied as an PMOS transistor and the switch 64' is embodied as an NMOS transistor. Thus, when the output SRi of the shift register is "low", the output voltage at the $V_{boostn}$ output 17 is connected to a "boost output" 65' via the switch 28 and the additional switch 64'—so that the voltage lower than the lower supply voltage $V_{SS}$ generated at the $V_{boostn}$ output 17 is passed to the boost output 65'. Similarly, when the output SRi of the shift register is "low", the output voltage at the $V_{boostp}$ output 17' is connected to another "boost output" 65 via the switch 28' and the additional switch 64—so that the voltage higher than the higher supply voltage $V_{DD}$ generated at the $V_{boostp}$ output 17' is passed to the boost output 65.

It would in principle be possible to combine the embodiments of FIGS. 20 and 24 and provide a voltage boost circuit having the switches 48,48' of FIG. 20 and the switches 64,64' of FIG. 24. Such a voltage boost circuit could provide $V_{DDH}$/$V_{SSH}$ outputs for both high and low values of the shift register output.

Industrial Applicability

A drive circuit of the invention may be integrated on a substrate of an AMLCD that uses thin film transistors (TFTs). A circuit of the invention may be of particular advantage when applied in displays for mobile applications or in other situation where it is desirable for power consumption and system complexity to be kept to a minimum.

The invention claimed is:
1. A drive circuit comprising:
at least one sampling circuit configured to sample an analogue input and output a voltage to a respective output;
a logic block connected between a source of a first voltage and a source of a second voltage, the first voltage being greater than the second voltage, and the logic block configured to output, in use, a respective output signal for each sampling circuit; and
at least one voltage boost circuit associated with a respective one of the sampling circuits, each voltage boost circuit configured to, upon receiving the respective signal output from the logic block, generate a boosted voltage signal and provide the boosted voltage signal to the respective sampling circuit, and each voltage boost circuit connected between the source of the first voltage and the source of the second voltage, and each voltage boost circuit including,
a boost capacitor having a first terminal connectable to the input to a respective sampling circuit,
a charging circuit configured to charge, in a charging period, the boost capacitor to substantially one of the first and second voltages, and
a boost circuit configured to, in a boosting period, connect a second terminal of the boost capacitor to a boost bias voltage; and
a switch configured to connect the first terminal of the boost capacitor to a storage capacitor during a boost phase.

2. A drive circuit as claimed in claim 1 wherein the boost bias voltage is one of the first and second voltages.

3. A drive circuit as claimed in claim 1, wherein the charging circuit comprises a first switch connected between the source of the first or second voltage and the first terminal of the boost capacitor.

4. A drive circuit as claimed in claim 1, wherein the boost circuit comprises a second switch connected between the source of the first or second voltage and the second terminal of the boost capacitor.

5. A drive circuit as claimed in claim 3, wherein the boost circuit comprises:
a second switch having a first terminal connected to the source of the first or second voltage, the second switch being controlled by the potential at the first terminal of the boost capacitor; and
wherein the first switch is controlled by the potential at the second terminal of the second switch.

6. A drive circuit as claimed in claim 1, wherein the boost bias voltage is a respective output signal from the logic block.

7. A drive circuit as claimed in claim 1, wherein each voltage boost circuit comprises a pass switch for disconnecting the first terminal of the boost capacitor from an output of the voltage boost circuit during the charging period.

8. A drive circuit as claimed in claim 6 wherein each voltage boost circuit further comprises a discharging switch for connecting the output of the voltage boost circuit to the other of the first and second voltages, the discharging switch being controlled to be open when the pass switch is closed.

9. A drive circuit as claimed in claim 3 wherein the first switch is a transistor.

10. A drive circuit as claimed in claim 9 wherein the first switch is a diode-connected transistor.

11. A drive circuit as claimed in claim 9 wherein the first switch is controlled by a respective output signal from the logic block.

12. A drive circuit as claimed in claim 7 wherein the logic block is a shift register.

13. A drive circuit as claimed in claim 12 wherein each voltage boost circuit comprises a second pass switch for connecting the first terminal of the boost capacitor to the output of the voltage boost circuit during at least part of the charging period.

14. A drive circuit as claimed in claim 12 wherein:
the at least one voltage boost circuit includes two or more voltage boost circuits;
the shift register outputs a plurality of output signals which are to be received by the respective two or more voltage boost circuits; and
a first output of a first one, of the two or more voltage boost circuits, which has received an ith output signal is connectable to a second output of a second one, of the two or more voltage boost circuits, which has received an (i−1)th output signal.

15. A drive circuit as claimed in claim 1, wherein each voltage boost circuit generates a boosted voltage signal having a voltage greater than the first voltage.

16. A drive circuit as claimed in claim 1, wherein each voltage boost circuit generates a boosted voltage signal having a voltage lower than the second voltage.

17. A drive circuit as claimed in claim 1, wherein each voltage boost circuit generates, at a first output, a first boosted voltage signal having a voltage greater than the first voltage and generates, at a second output, a second boosted voltage signal having a voltage lower than the second voltage.

18. A display device comprising a drive circuit as defined in claim 1.

19. A display device comprising a drive circuit as defined in claim 1.

20. A display device as claimed in claim 19 wherein the drive circuit further comprises a switch for connecting the first terminal of the boost capacitor to a storage capacitor during the boost phase.

21. A display device as claimed in claim 19 wherein the at least one voltage boost circuit shares a common boost capacitor.

22. A display device as claimed in claim 3 wherein the voltage boost circuit comprises:
a second switch having a first terminal connected to the source of the first or second voltage, the second switch being controlled by the potential at the first terminal of the boost capacitor; and
wherein the first switch is controlled by the potential at the second terminal of the second switch.

23. A display device as claimed in claim 18 wherein each voltage boost circuit generates a boosted voltage signal having a voltage greater than the first voltage.

24. A display device as claimed in claim 18 wherein each voltage boost circuit generates a boosted voltage signal having a voltage lower than the second voltage.

25. A display device as claimed in claim 18 wherein each voltage boost circuit generates, at a first output, a first boosted voltage signal having a voltage greater than the first voltage and generates, at a second output, a second boosted voltage signal having a voltage lower than the second voltage.

26. A display device as claimed in claim 18, wherein the display device comprises a plurality of source lines, each source line being connected to a respective output of the drive circuit.

27. A display device as claimed in claim 18, further comprising a liquid crystal display device.

28. A display device as claimed in claim 27, further comprising an active matrix liquid crystal display device.

29. A drive circuit comprising:
at least one sampling circuit configured to sample an analogue input and output a voltage to a respective output;
a logic block connected between a source of a first voltage and a source of a second voltage, the first voltage being greater than the second voltage, and the logic block configured to output, in use, a respective output signal for each sampling circuit; and
at least one voltage boost circuit associated with a respective one of the sampling circuits, each voltage boost circuit configured to, upon receiving the respective signal output from the logic block, generate a boosted voltage signal and provide the boosted voltage signal to the respective sampling circuit and each voltage boost circuit connected between the source of the first voltage and the source of the second voltage, and each voltage boost circuit including,
a boost capacitor having a first terminal connectable to the input to a respective sampling circuit,
a charging circuit configured to charge, in a charging period, the boost capacitor to substantially one of the first and second voltages, and
a boost circuit configured to, in a boosting period, connect a second terminal of the boost capacitor to a boost bias voltage,
wherein the voltage boost circuits share a common boost capacitor.

* * * * *